(12) United States Patent
Kitagawa

(10) Patent No.: US 11,676,649 B2
(45) Date of Patent: Jun. 13, 2023

(54) SENSE TIMING COORDINATION FOR MEMORY

(71) Applicant: Micron Technology, Inc., Boise, ID (US)

(72) Inventor: Makoto Kitagawa, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/383,090

(22) Filed: Jul. 22, 2021

(65) Prior Publication Data

US 2023/0024961 A1    Jan. 26, 2023

(51) Int. Cl.
G11C 11/4076 (2006.01)
G11C 11/22 (2006.01)
G11C 11/4091 (2006.01)
G11C 11/408 (2006.01)

(52) U.S. Cl.
CPC ........ G11C 11/2273 (2013.01); G11C 11/221 (2013.01); G11C 11/2257 (2013.01); G11C 11/2293 (2013.01); G11C 11/4076 (2013.01); G11C 11/4085 (2013.01); G11C 11/4091 (2013.01)

(58) Field of Classification Search
CPC .................................................. G11C 11/2273
See application file for complete search history.

(56) References Cited

U.S. PATENT DOCUMENTS

| | | | | |
|---|---|---|---|---|
| 6,144,230 | A * | 11/2000 | Kim | G11C 7/06 327/51 |
| 6,473,330 | B1 * | 10/2002 | Ogiwara | G11C 11/22 365/205 |
| 7,952,904 | B2 * | 5/2011 | Zhang | H01L 25/0657 365/45 |
| 2002/0118588 | A1 * | 8/2002 | Kato | G11C 11/4091 365/207 |
| 2004/0042275 | A1 | 3/2004 | Yoshizawa et al. | |
| 2010/0039851 | A1 | 2/2010 | Morita et al. | |
| 2011/0267914 | A1 | 11/2011 | Ishikura et al. | |
| 2012/0307561 | A1 | 12/2012 | Joo et al. | |
| 2018/0144779 | A1 | 5/2018 | Willcock et al. | |
| 2021/0065799 | A1 * | 3/2021 | Kim | G11C 5/025 |

OTHER PUBLICATIONS

"International Search Report and Written Opinion of the International Searching Authority," issued in connection with Int'l Appl. No. PCT/US2022/073490 dated Oct. 27, 2022 (10 pages).

* cited by examiner

*Primary Examiner* — Min Huang
(74) *Attorney, Agent, or Firm* — Holland & Hart LLP

(57) ABSTRACT

Methods, systems, and devices for sense timing coordination are described. In some systems, to sense the logic states of memory cells, a memory device may generate an activation signal and route the activation signal over a signal line (e.g., a dummy word line) located at a memory array level of the memory device to one or more sense amplifiers. Based on receiving the activation signal, a sense amplifier may latch and determine the logic state of a corresponding memory cell. A first sense amplifier may sense a state of a first memory cell at a first time and a second sense amplifier may sense a state of a second memory cell at a second time in response to the same activation signal due to a propagation delay of the activation signal routed over the signal line (e.g., and corresponding to a propagation delay for activating a word line).

34 Claims, 9 Drawing Sheets

SENSE TIMING COORDINATION FOR MEMORY

FIELD OF TECHNOLOGY

The following relates generally to one or more systems for memory and more specifically to sense timing coordination for memory.

BACKGROUND

Memory devices are widely used to store information in various electronic devices such as computers, user devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, and others. Memory devices may be volatile or non-volatile. Non-volatile memory devices, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
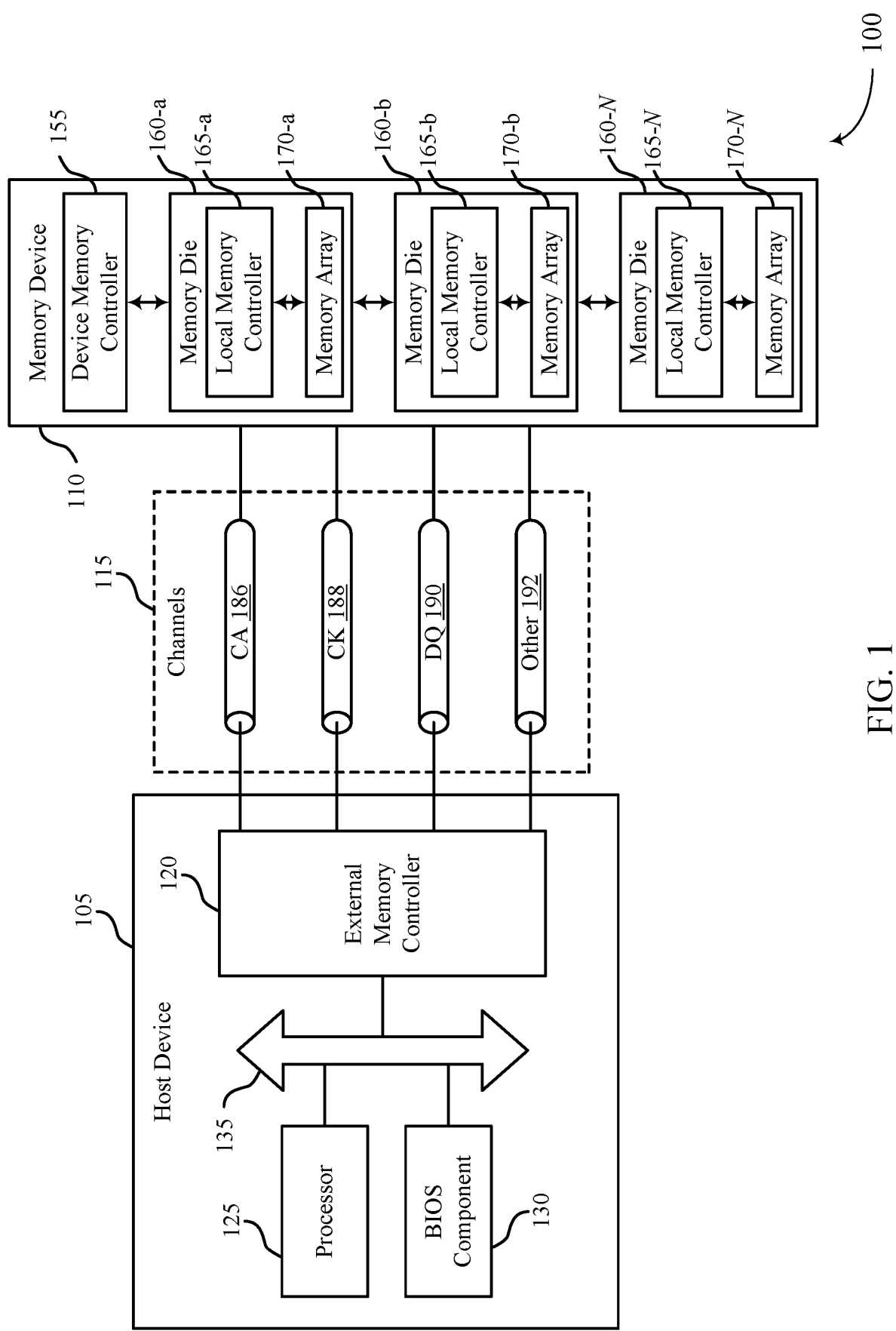
FIG. 1 illustrates an example of a system that supports sense timing coordination for memory in accordance with examples as disclosed herein.

A memory device may include a memory array of memory cells, where each memory cell of the memory array may be coupled with a respective digit line of the memory array and a respective word line of the memory array. In some examples, the memory device may receive a read command from a host device to determine logic states of one or more memory cells of a row of memory cells of the memory array (e.g., memory cells coupled with a common word line). In order to determine the logic states of the memory cells in the row, the memory device may initiate a read operation. To support the read operation, the memory device may activate (e.g., precharge) respective digit lines corresponding to the memory cells to read from the row of memory cells. The memory device may increase the voltage of the word line of the row of memory cells to a threshold voltage which may allow for signal development (e.g., charge sharing) between memory cells of the row and the respective precharged digit lines. After a threshold time, sense amplifiers coupled with each of the respective digit lines may latch. A latched sense amplifier may determine a logic state stored in a respective memory cell based on a signal (e.g., voltage) developed on a digit line coupled with the sense amplifier (e.g., by comparing the voltage of the digit line to a reference voltage, where the voltage of the digit line may depend on a state of the memory cell, such as an amount of charge extracted from or supplied to the memory cell via the precharged digit line). The sense amplifier may determine whether the voltage of the digit line, at the time of latching, corresponds to a logic "1" or a logic "0," for example, if the memory cell stores one bit of data.

The sense amplifiers may latch in response to an activation signal. In some systems, a memory device may route the activation signal to each of the sense amplifiers through conductive lines located in a layer (e.g., a circuit-under-array (CuA) layer, which may include routing lines for signals—e.g., as part of a metallization layer, which may be a sublayer or otherwise included in the CuA layer—along with support circuitry for operating a memory array, such as sense amplifiers) different from the memory array layer (e.g., a layer that includes access lines and memory cells). As used herein, a layer of a memory device may refer to a collection of components that are at a same separation distance (or distance range) from a substrate, wherein one layer may be above or below another layer (e.g., another collection of components). Hence, a layer of a memory device may alternatively be referred to as a level of the memory device and may include multiple materials, multiple material layers, or any combination thereof.

In some cases, conductive lines at a CuA layer or other layer distinct from the memory array layer may be relatively more conductive than access lines or other signal lines within the memory array layer (e.g., due to differences in materials, differences in geometry, or for one or more other reasons). As such, each sense amplifier may latch at substantially the same time, with a relatively negligible delay in between different sense amplifiers latching to sense the voltages of the respective digit lines (e.g., with timing differences below a threshold time delay). Although each sense amplifier may latch at relatively the same time (e.g., with the delay in latching between a first sense amplifier and a second sense amplifier being below the threshold time delay), charge sharing between each memory cell in a row and its respective digit lines may trigger at relatively more different times based on a greater propagation delay associated with the word line shared by the row memory cells. For example, charge sharing may initiate relatively sooner (e.g., by an amount of time greater than the threshold time delay) for a memory cell located relatively closer to word line driver circuitry than a memory cell located farther away from the word line driver circuitry. This delay may be due to a rate at which the voltage may propagate along the word line (e.g., the word line may be relatively less conductive than the conductive line carrying the activation signal).

If the sense amplifiers latch at relatively more similar times but the memory cells initiate charge sharing at relatively more different times, a memory cell that is located farther away from the word line driver circuitry may have a relatively smaller read window (e.g., or sense window) than a memory cell located relatively close to the word line driver circuitry. A relatively small read window may potentially reduce the accuracy of read operations at the memory device.

To better coordinate sense timing with the timing at which signal development occurs on different digit lines (e.g., digit lines for memory cells that share a word line but are located at different distances from a driver for that word line), a memory device may route an activation signal for latching sense amplifiers corresponding to a row of memory cells through a signal line that may be located at the memory array level of the memory device (e.g., as opposed to the CuA level). In some examples, the signal line may have similar conductive properties to the word lines of the memory array (e.g., more similar, relative to a conductive line within a CuA level or other level different than the memory array level) and may run parallel to the word lines of the memory array. For example, the signal line may be an example of a dummy word line. During a read operation, the memory device may drive the activation signal through the signal line to each sense amplifier corresponding to one or more memory cells of the row of memory cells. Because the signal line may be located at the memory array level (e.g., and may share or have one or more substantially similar properties, such as conductive properties, with the word lines), the activation signal may reach each sense amplifier at a different time or with a relatively greater time in between (e.g., greater than the threshold time delay) than if the signal was routed through metal layers (e.g., at the CuA level, in a metallization layer). As such, a sense amplifier located near activation signal driver circuitry may latch relatively sooner than a sense amplifier located relatively farther from the activation signal driver circuitry. The delay introduced between the latching of different sense amplifiers due to routing the activation signal along the signal line may thus be more similar to the delay introduced between initiation of signal development for different memory cells along a word line due to being at different distances relative to a driver for the word line (e.g., based on the signal line and the word line sharing one or more properties).

By latching the sense amplifiers at different times, different memory cells in the row of memory cells may stay in a signal development (e.g., charge sharing) phase for a similar amount of time, such that the read window (e.g., or sense window) may remain relatively constant for any memory cells along the word line (e.g., independent of the distance between a memory cell and the word line driver circuitry). Accordingly, routing the activation signal through the signal line located at the memory array level of the memory device may improve the reliability of read operations, for example, as compared to systems sending the activation signal at the CuA layer of a memory device.

Features of the disclosure are initially described in the context of systems and dies as described with reference to FIGS. 1 and 2. Additional features of the disclosure are described in the context of a sensing scheme and memory device architectures as described with reference to FIGS. 3 through 6. These and other features of the disclosure are further illustrated by and described with reference to an apparatus diagram and flowcharts that relate to sense timing coordination for memory as described with reference to FIGS. 7 through 11. Though some examples may be described herein in terms of dynamic RAM (DRAM), ferroelectric RAM (FeRAM), or other capacitive-based memory types, it is to be understood that aspects of the teachings herein may be applied to any memory device that includes memory cells of any type.

FIG. 1 illustrates an example of a system 100 that supports sense timing coordination for memory in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channels 186 may include a read command with an address of the desired data. In some examples, a CA channel 186 may include any quantity of signal paths to decode one or more of address or command data (e.g., eight or nine signal paths).

In some examples, the memory device 110 may perform a sensing procedure for a set of memory cells, such as in response to receiving a command from the host device 105 (e.g., a read command, a refresh command, or any other command in response to which the memory device may sense the state of a set of memory cells) or an internal determination (e.g., an internal determination to perform a refresh). For example, the memory device 110 may sense logic states of memory cells included in a row of memory cells of the memory array 170. Each memory cell of the row may be coupled with a common word line and a respective digit line. To sense logic states of memory cells in the row of memory cells, the memory device 110 may precharge each digit line corresponding to the respective memory cells. Based on pre-charging the digit lines, the memory device 110 may charge the word line common to the row of memory cells to a threshold voltage, which may initiate charge sharing between memory cells and respective digit lines (e.g., initiating signal development on the digit lines, based on the respective states of the respective memory cells). In some examples, different portions of the word line may reach the threshold voltage at different times despite sharing a common word line driver. For example, a first portion of the word line may reach the threshold voltage relatively sooner than a second portion of the word line located farther from the word line driver than the first portion. As such, there may be a delay in initiating signal development on the different digit lines for memory cells that is dependent on the location of each memory cell along the word line (e.g., dependent on the distance of the memory cell from the word line driver).

A threshold time after signal development is initiated on a set of digit lines, the memory device 110 may latch sense amplifiers coupled with each respective digit line. Latching may refer to sensing components (e.g., sense amplifiers or other sensing components) determining logic states of respective memory cells based on the signals extracted from the respective digit lines, where the logic states may be determined based on a sensed signal as of the time of the latching. In some examples, a sense amplifier may determine the voltage for a digit line (e.g., may couple with the digit line or otherwise latch) in response to an activation signal provided by the memory device 110. In some systems, the activation signal may be routed through a layer below the memory array layer (e.g., in a metallization layer, such as the CuA layer) of a memory device to each sense amplifier and, as such, each sense amplifier may perform a sensing operation with negligible timing differences between the sensing operations (e.g., the timing delay between different sense amplifiers may be below a threshold delay). However, signal development for memory cells of the memory device may start at different times depending on the location of the memory cells along a word line. A relatively longer duration of signal development prior to the sense amplifier performing the sensing operation may allow for a relatively larger read window (e.g., a greater difference in voltage thresholds corresponding to different logic states). Therefore, if signals develop along some digit lines later than others, triggering sensing at each sense amplifier corresponding to the row of memory cells at relatively the same time may result in different read windows for different memory cells of the row (e.g., based on different start times for the signal development). For example, memory cells located farther from word line drive circuitry may correspond to relatively smaller read windows (e.g., with a relatively narrower difference in voltage thresholds corresponding to different logic states, where the memory device may fail to distinguish a voltage corresponding to one logic state from a voltage corresponding to a different logic state) when compared to memory cells located closer to the word line drive circuitry, due to signal development being later to begin for memory cells located farther from the word line drive circuitry.

To coordinate sense timing with signal development, a memory device 110 may route an activation signal through a signal line that is located at the memory array layer of the memory device 110 as opposed to a lower layer (e.g., CuA layer, or a metallization layer, which may in some cases be considered part of a CuA layer). In some examples, the signal line may be an example of a dummy word and, as such, may run parallel to the word lines of the memory array 170. During a read operation, the memory device 110 may route the activation signal through the signal line to sense amplifiers corresponding to the row of memory cells. Because the dummy word line may have similar conductive characteristics to a word line of the memory array 170, the activation signal may arrive at each sense amplifier with a different delay, which may more closely correspond to the different delays with which the word line may reach a threshold voltage and signal development may begin on different digit lines corresponding to the different sense amplifiers. For example, the activation signal may reach a sense amplifier located near an activation signal driver relatively sooner than a sense amplifier located farther away from the activation signal driver. The delay involved in activating different sense amplifiers due to the signal line may be similar to the delay involved in initiating signal development at different memory cells along the word line. As such, signal development may occur on the different digit lines for similar amount of times based on experiencing similar delays in both initiating signal development on a digit line and using the voltage of the digit line to determine the logic state of a memory cell. Performing signal development for similar amounts of time may result in similar read windows for the memory cells (e.g., regardless of a distance from the word line driver circuitry to a respective memory cell), thereby avoiding undesirably small read windows for some memory cells or otherwise supporting reliable determination of logic states based on sensed voltage values.

Figure 2:
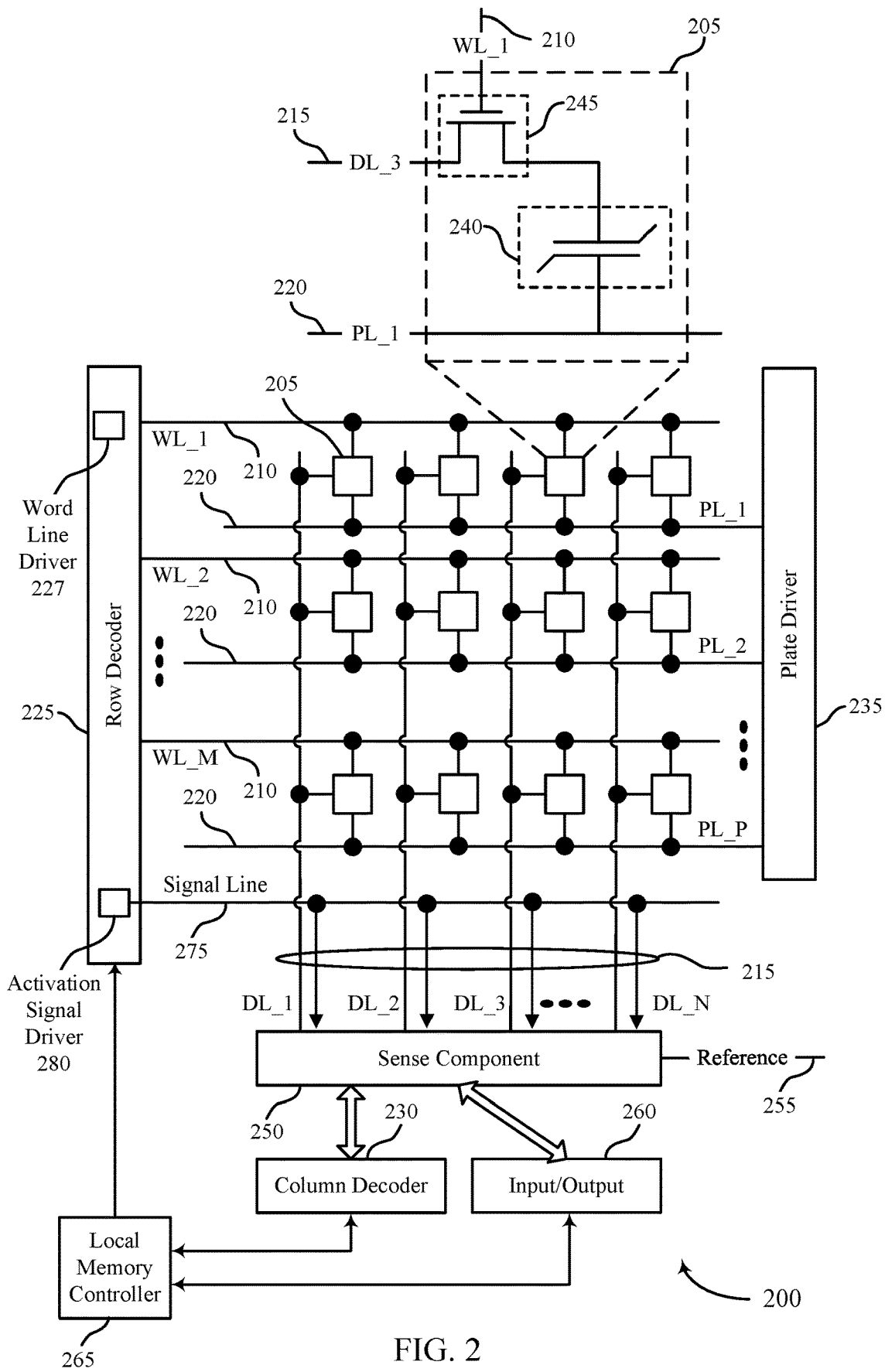
FIG. 2 illustrates an example of a memory die that supports sense timing coordination for memory in accordance with examples as disclosed herein.

FIG. 2 illustrates an example of a memory die 200 that supports sense timing coordination for memory in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge or polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, or the plate lines 220.

Operations such as reading and writing may be performed on memory cells 205 by activating or selecting access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225 (which may include one or more word line drivers 227, such as a respective word line driver 227 for each word line 210, though only one word line driver 227 is shown in FIG. 2 for the sake of clarity), a column decoder 230, a plate driver 235, and an activation signal driver 280. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. Although FIG. 2 illustrates components such as the row decoder 225, the column decoder 230, the plate driver 235, and the activation signal driver 280 located adjacent to the array of memory cell 205, it is understood that these component may be located below or above the array of memory cells 205. In addition, components such as the row decoder 225, the column decoder 230, the plate driver 235, and the activation signal driver 280 may be embedded in a layer different from the array of memory cells (e.g., in a CuA layer different from the memory array layer) and signals from these component may be routed through one or more conductive lines to the array of memory cells 205.

Selecting or deselecting the memory cell 205 may be accomplished by activating or deactivating the switching component 245. The capacitor 240 may be in electronic communication with the digit line 215 using the switching component 245. For example, the capacitor 240 may be isolated from the digit line 215 when the switching component 245 is deactivated, and the capacitor 240 may be coupled with the digit line 215 when the switching component 245 is activated.

A word line 210 may be a conductive line in electronic communication with (e.g., coupled with) a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205. In some examples, the plate line 220 may be coupled with a plate of the capacitor 240, and the plate or the plate line 220 may be common to (e.g., shared by) multiple memory cells 205. Although FIG. 2 shows that the plate line 220 may be shared by the memory cells 205 corresponding to a single row or a single word line 210, it is to be understood that a plate line 220 or plate of a capacitor 240 may be common to memory cells 205 across any quantity of rows or columns of a memory array (e.g., a plate line 220 coupled with multiple memory cells 205 or a plate common to multiple capacitors 240 may extend in both the x and y directions).

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). Such comparing may occur as of (or begin to occur as of) a time that a sense amplifier within the sense component 250 is latched. The detected logic state of the memory cell 205 may be provided as an output of the sense component 250 (e.g., to an input/output 260), and may indicate the detected logic state to another component of a memory device 110 that includes the memory die 200. In some examples, the sense component 250 may be coupled with a signal line 275.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, a target plate line 220, or a combination thereof coupled with the target memory cell 205. The local memory controller 265 may activate the target word line 210, the target digit line 215, the target plate line 220, or the combination thereof (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255 (e.g., using a respective sense amplifier). Based on the comparison, the sense component 250 may determine a logic state that is stored on the memory cell 205.

In some systems, a memory device may route an activation signal for latching one or more sense amplifiers of the sense component 250 through one or more signal lines 275. In some examples, a signal line 275 may be located in the array of memory cells 205 (e.g., at the memory array level) and may run parallel to word lines 210. The signal line 275 may possess similar conductive properties as the word lines 210 (e.g., the signal line 275 may be an example of a dummy word line). In some examples, the memory device may select a row of memory cells 205 and may perform a read operation on the selected row of memory cells 205 to determine logic states stored at the row of memory cells. During the read operation, the memory device may activate digit lines 215 and a word line 210 that are coupled with respective memory cells 205 of the row. The memory device may route an activation signal through the signal line 275 using an activation signal driver 280. In some examples, the activation signal driver 280 may be included in the row decoder 225, or the activation signal driver 280 be separate from the row decoder 225.

The activation signal may latch each sense amplifier (e.g., included in the sense component 250) for the row of memory cells 205. Because the activation signal is routed through (e.g., via) the signal line 275, the sense amplifiers may latch at different times. That is, a first sense amplifier may determine a logic state stored at a first memory cell 205 of the row at a different time that a second sense amplifier determines a logic state stored at a second memory cell 205 of the row due to a propagation delay of the activation signal along the signal line 275. In some examples, memory cells 205 located closer to the activation signal driver 280 may be associated with a relatively shorter delay prior to latching than memory cells located relatively farther away from the activation signal driver 280. The techniques described herein may allow for increased read windows for memory cells 205 located relatively farther away from the row decoder 225 along the word lines 210, or at least for different memory cells 205 located at different distances from the row decoder 225 to have more similar read windows. For example, the delay in activating a transistor at a memory cell 205 due to a signal propagating along a word line 210 may correspond to (e.g., be similar to, within a difference threshold) a delay in activating a sense amplifier of the sense component 250 due to the activation signal propagating along the signal line 275.

Figure 3:
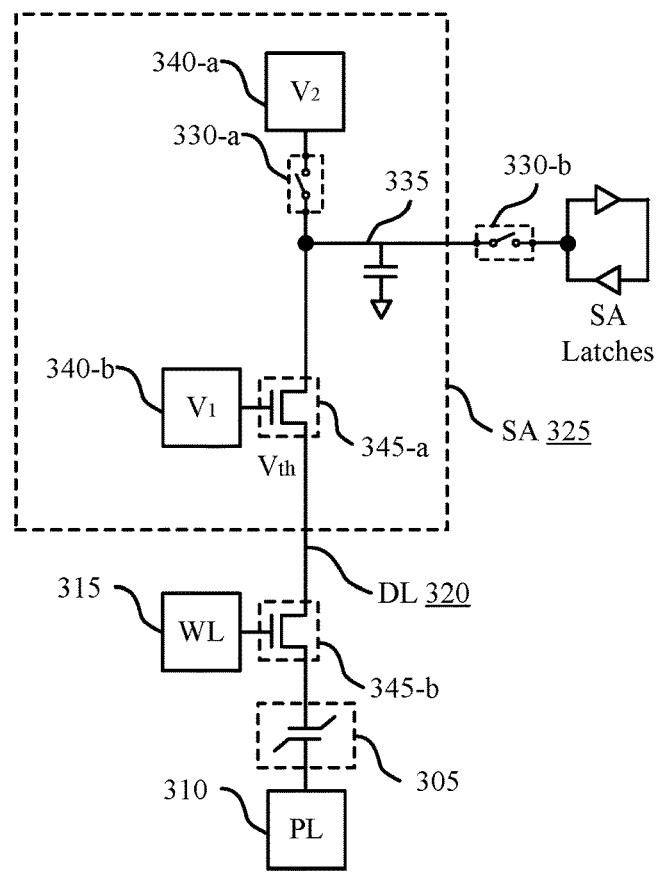
FIG. 3 illustrates an example of a sensing scheme that supports sense timing coordination for memory in accordance with examples as disclosed herein.
Figure 3:
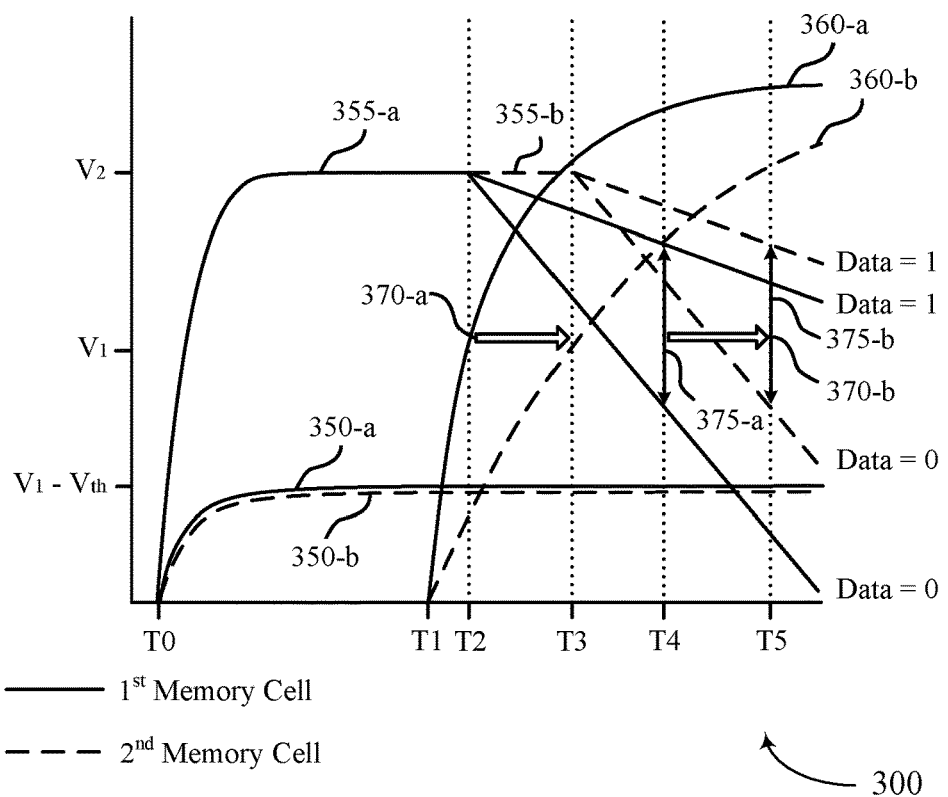

FIG. 3 illustrates an example of a sensing scheme 300 that supports sense timing coordination for memory in accordance with examples as disclosed herein. In some examples, the sensing scheme 300 may implement aspects of a system 100 and a memory die 200. For example, the sensing scheme 300 may include a memory cell 305, a plate line 310, a word line 315, and a digit line 320, which may be examples of a memory cell 205, a plate line 220, a word line 210, and a digit line 215 as described with reference to FIG. 2.

As described with reference to FIG. 2, a memory device may perform a sensing operation to determine a logic state of one or more memory cells of a memory array. FIG. 3 illustrates a circuit which may be used to perform the sensing operation on a single memory cell 305. The memory cell 305 may be coupled with a plate line 310, a word line 315, and a digit line 320. Additionally, the digit line 320 may be coupled with a sense amplifier 325. In one example of the sensing operation, the memory device may activate (e.g., close) a switch 330-a, which may allow for a node 335 (e.g., the $V_{sig}$ node) to precharge to a first voltage (e.g., $V_2$) using a voltage source 340-a (e.g., a capacitor coupled with the node 335 may precharge to the first voltage). Additionally, the memory device may precharge the digit line 320 to a second voltage using a voltage source 340-b. For example, the second voltage may be the voltage supplied by the voltage source 340-b (e.g., $V_1$) minus a threshold voltage associated with a transistor 345-a (e.g., $V_{th}$). In some examples, the voltage source 340-b may be an example of a metal-oxide-semiconductor (MOS) cascode device. While the node 335 and the digit line 320 precharge, the plate line 310 may be maintained at a relatively low voltage (e.g., ground voltage).

When both the node 335 and the digit line 320 are precharged to their respective voltages, the memory device may increase the voltage of the word line 315 to a threshold voltage associated with a transistor 345-b (e.g., $V_1$). Once the word line 315 reaches the threshold voltage associated with the transistor 345-b, the transistor 345-b may become conductive and signal development may begin (e.g., charge sharing may begin between the memory cell 305 and the node 335, via the digit line 320). For example, a signal (e.g., voltage) may develop on the digit line 320 (e.g., at the node 335, such as a capacitor) based on the charge sharing. Some time (e.g., a threshold time) after signal development starts, the memory device may activate a switch 330-b and the sense amplifier may latch. Once the switch 330-b is activated, the sense amplifier may determine a logic state stored at the memory cell 305 based on the signal developed on the digit line 320 (e.g., a voltage at the node 335).

FIG. 3 further illustrates a timing diagram for the sensing scheme 300 that may be used to determine logic states stored in at least one row of memory cells using the techniques as described herein. The solid lines of the timing diagram may represent signals associated with a first memory cell that is located relatively close to word line driver circuitry (e.g., located along a first portion of the word line 315, relatively close to a word line driver 227 for the word line 315) and the dotted lines may represent signals associated with a second memory cell that is located relatively farther away from the word line circuitry (e.g., located along a second portion of the word line 315, relatively far from the word line driver 227 for the word line 315). The first memory cell and the second memory cell may be coupled with a common word line 315 and respective digit lines 320, and each respective digit line 320 may be coupled with a respective sense amplifier 325.

A sensing node signal 355-a may represent a voltage at a first node 335 of a first sense amplifier 325 corresponding to the first memory cell and the sensing node signal 355-b may represent a voltage at a second node 335 of a second sense amplifier 325 corresponding to the second memory cell. The digit line signal 350-a may represent a signal on a first digit line 320 coupled with the first memory cell and the first node 335, and the digit line signal 350-b may represent a signal on a second digit line 320 coupled with the second memory cell and the node 335. Moreover, the word line signal 360-a may represent a voltage of the word line 315 at a place where the word line 315 is coupled with the first memory cell (e.g., with a first transistor 345 configured to act as a selection device for the first memory cell) and the word line signal 360-b may represent a voltage of the word line 315 at a place where the word line 315 is coupled with the second memory cell (e.g., with a second transistor 345 configured to act as a selection device for the second memory cell). Although the timing diagram shows signals associated with two memory cells, this is for the sake of clarity in illustrating and describing the teachings herein, and it is understood that any quantity of memory cells may be present along the common word line 315.

At T0, the sensing operation may begin. For example, at T0, the memory device may begin pre-charging the sensing node signals 355 and the digit line signals 350. In some examples, the sensing node signals 355 may be precharged to $V_2$ and the digit line signals may be charged to $V_1-V_{th}$. The precharging may effectively reduce parasitic capacitance on the digit lines 320, such that a state of each memory cells may be more accurately or reliably determined based on a signal at the corresponding node 335, using the corresponding sense amplifier 325.

At T1, the sensing node signals 355 and the digit line signals 350 may be fully precharged (e.g., precharged to a threshold voltage) and the voltage of the word line signals 360 may begin to increase. For example, the memory device may activate a word line 315 coupled with the first and the second memory cells. As shown in FIG. 3, the word line signal 360-a may increase in voltage at a faster rate than the word line signal 360-b because the first memory cell may be located relatively closer to the word line circuitry (e.g., closer to the source of the activation signal for the word line 315) than the second memory cell. As such, the word line signal 360-a (e.g., the voltage at a first portion of the word line 315 coupled with the first memory cell) may reach a threshold voltage for the first transistor 345-b (e.g., $V_1$) at T2 and the word line signal 360-b (e.g., the voltage at a second portion of the word line 315 coupled with the second memory cell) may reach the threshold voltage for the second transistor 345-b (e.g., $V_1$) at T3. The timing difference between T2 and T3 may be known as a delay 370-a. As described herein, the delay 370-a may be due to the propagation delay of the signal through the word line 315, such that activating the word line 315 causes the voltage of the word line 315 to increase relatively more quickly at the end of the word line 315 near the source of the signal (e.g., near the word line driver 227 for the word line 315) than at the end of the word line 315 far from the source of the signal.

Once a word line signal 360 reaches the threshold voltage of the transistor 345-b for a memory cell (e.g., $V_1+V_{th}$ for the transistor 345-b), the transistor 345-b for the memory cell may become conductive and the memory cell may begin signal development at (e.g., charge sharing with) the corresponding sensing node (e.g., node 335). For example, the sensing node signal 355-a for the first memory cell may decrease in voltage due to the signal development beginning at T2, and the sensing node signal 355-b for the second memory cell may decrease in voltage due to the signal development beginning at T3. The rate at which the voltages of the sensing node signals 355 decrease may depend on the logic state stored at the corresponding memory cell. For example, if the corresponding memory cell stores a logic state of 1, the voltage of a sensing node signal 355 may decrease at a lesser rate than compared to if the corresponding memory cell stores a logic state of 0.

At least a threshold time after signal development begins for the first memory cell, a first sense amplifier corresponding to the first memory cell may latch. Similarly, at least the threshold time after signal development begins for the second memory cell, a second sense amplifier corresponding to the second memory cell may latch. Each sense amplifier may determine a logic state stored at the respective memory cell. In some examples, the sense amplifiers may latch in response to receiving a common (e.g., shared) activation signal. As described herein, the activation signal may be routed through a signal line that is located at the memory array level of the memory device. For example, the signal line may be parallel to one or more components associated with the memory array (e.g., word lines 315). In one example, the signal line may be an example of a dummy word line and may run parallel to word lines of the memory array that includes the sensed memory cells. A dummy word line may be fabricated the same as a word line but may not be coupled with a set of memory cells or may be coupled with a set of dummy memory cells that the memory device may not use for data storage. Because the signal line may possess similar conductive characteristics to a word line 315, there may be some delay between the activation signal arriving at different sense amplifiers for different memory cells. For example, the first sense amplifier corresponding to the first memory cells may receive the activation signal at T4 and the second sense amplifier corresponding to the second memory cell may receive the activation signal at T5. The timing difference between T4 and T5 may be known as a delay 370-b. In some examples, the delay 370-b may correspond to the delay 370-a. For example, the duration of the delay 370-b may equal the duration of the delay 370-a (e.g., within an error threshold), or the duration of the delay 370-b may at least be more similar to the duration of the delay 370-a than were the activation signal instead routed through a more conductive signal line at a level of the memory device different than the memory array level.

In some examples, the first and second sense amplifiers may determine the logic state stored at the respective memory cells by comparing the voltage of the sensing node signal 355 for the sensing node 335 at the threshold time (e.g., at T4 for the first memory cell and at T5 for the second memory cell) to a reference voltage. As shown in FIG. 3, a relatively high voltage value may represent a logic state value of 1 and a relatively low voltage value may represent a logic value of 0. In some examples, a memory device may store a threshold value, above which a signal corresponds to a logic state of 1 and below which a signal corresponds to a logic state of 0. Alternatively, a memory device may store a first threshold range corresponding to a logic state of 1 and a second threshold range corresponding to a logic state of 0. The difference between an expected high voltage value corresponding to a logic state of 1 and an actual low voltage value corresponding to a logic state of 0 may be known as a sensing window 375. A relatively larger sensing window 375 may increase the reliability of the sense amplifiers to determine the correct logic state stored in respective memory cells. That is, a relatively small sensing window 375 may cause a voltage corresponding to one logic state to appear to indicate the other logic state (e.g., the voltage indicating a logic state of 0 may satisfy a threshold for determining that a voltage indicates a logic state of 1). Due to the delay 370-b, the sensing window 375-a associated with the first memory cell and the sensing window 375-b associated with the second memory cell may correspond to (e.g., be substantially equal in size to) one another. For example, the size of the sensing window 375-a may equal the size of the sensing window 375-b (e.g., within an error threshold).

If the delay 370-b did not exist or were much smaller than the delay 370-a, for example using other techniques (e.g., if the activation signal is sent to the sense amplifiers in metallization layers below the memory array with negligible delay), the sensing window 375-b may be smaller than the sensing window 375-a by a greater amount relative to when using the structures and techniques described herein. For example, absent the structures and techniques described herein, the delay 370-a may still exist for memory cells due to the propagation delay of activating the memory cells at T2 and T3 using the word line 315, but the activation signal may activate the first and second sense amplifiers at approximately the same time, T4. As such, the method as described herein, which causes the delay 370-b to be better aligned with the delay 370-a, may increase the reliability of determining logic states stored at memory cells of a memory array by maintaining a similar sensing window 375 for each memory cell coupled with a word line 315 (e.g., independent of the distance that a particular memory cell may be from the word line driver circuitry).

Figure 4:
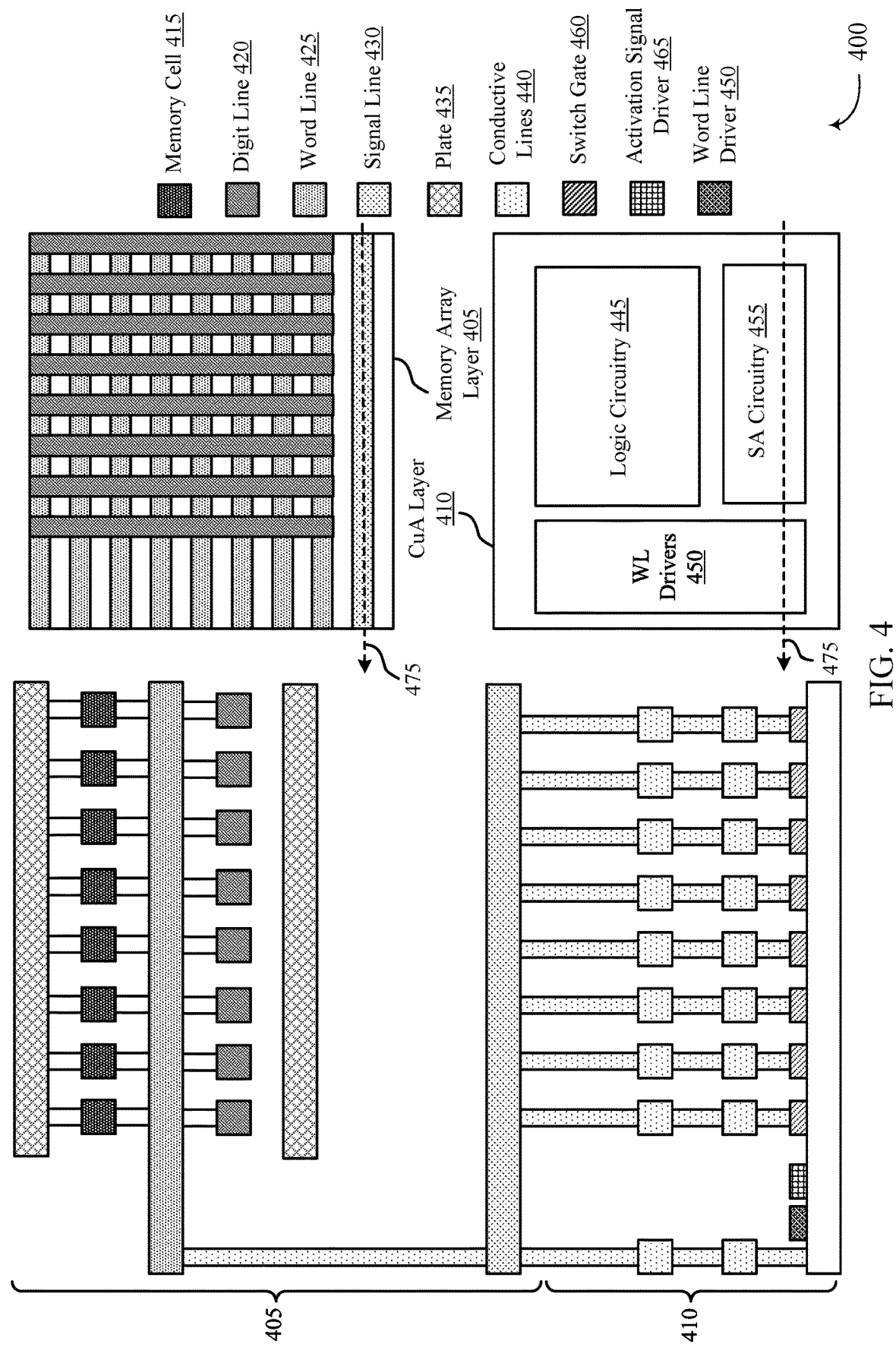
FIGS. 4 through 6 illustrate examples of memory device architectures that support sense timing coordination for memory in accordance with examples as disclosed herein.

FIG. 4 illustrates an example of a memory device architecture 400 that supports sense timing coordination for memory in accordance with examples as disclosed herein. In some examples, the memory device architecture 400 may include or implement aspects of a system 100, a memory die 200, and a sensing scheme 300.

In some examples, a memory device may include multiple layers (or levels). For example, the memory device may include at least a memory array layer 405 and a CuA layer 410. The upper-right portion of FIG. 4 may show a top-down view of the memory array layer 405, while the lower-right portion of FIG. 4 may show a top-down view of the CuA layer 410. The left portion of FIG. 4 may show side views of the memory array layer 405 and the CuA layer 410 corresponding to cross sections 475.

The memory array layer 405 may include components associated with a memory array such as memory cells 415, digit lines 420, word lines 425, signal lines 430, and plates 435. A plate 435 may be an example of a plate line 220 or plate of one or more capacitors 240. FIG. 4 shows the plate 435 as common to (e.g., coupled with each of) a set of memory cells 415 and as extending in a direction across the page. In some examples, the plate 435 may further extend in an additional direction into or out of the page and be common to additional memory cells that are coupled with additional word lines 425. In some examples, the digit lines 420 may run perpendicular to the word lines 425 and a memory cell 415 may be located at an intersection of a word line 425 and a digit line 420 (coupled with a respective word line 425 and a respective digit line 420). Moreover, the memory array layer 405 may include multiple memory arrays or decks stacked on top of one another. For example, the memory array layer 405 may include a first memory array and a second memory array, where each memory array has its own set of digit lines 420, word lines 425, and plates 435. The CuA layer 410 may include circuitry used to generate and convey signals or commands to the memory array layer 405. For example, the CuA layer 410 may include logic circuitry 445, word line drivers 450, and sense amplifier circuitry 455. More specifically, the CuA layer 410 may include switch gates 460, activation signal drivers 465, and word line drivers 450. In some cases, the CuA layer 410 may include one or more metallization layers. A cross section 475 illustrates the different layers of the memory array taken from the signal line 430.

As described herein, the memory device may include a signal line 430 that is located at the memory array layer 405. In some examples, the signal line 430 may run parallel to the word lines 425 and may share characteristics with word lines 425. For example, the signal line 430 may have the same cross-sectional area as a word line 425, the signal line 430 may have the same conductive properties as a word line 425, the signal line 430 may be an example of a dummy word line, or any combination thereof. The signal line 430 may be configured to carry an activation signal to one or more sense amplifiers, where the one or more sense amplifiers are configured to sense a logic state of a respective memory cell based on the activation signal. The sense amplifiers may be couplable with respective digit lines 420 using respective switch gates 460. For example, the sense amplifiers may include the switch gates 460.

In some examples, the memory device may perform a sense operation on one or more memory cells of a row of memory cells to determine the logic states stored by the one or more memory cells of the row. The memory device may activate a word line 425 corresponding to the row of memory cells. The memory device may activate the word line 425 by increasing the voltage of the word line 425 to a threshold voltage using the corresponding word line driver 450. As described with reference to FIG. 3, different portions of the word line 425 may reach the threshold voltage at different times. For example, a first portion of the word line may reach the threshold voltage at a first time, and a second portion of the word line may reach the threshold voltage at a second time. The difference between the first time and the second time may be known as a first delay.

Once a portion of the word line 425 reaches the threshold voltage, a transistor whose gate is coupled with the portion of the word line 425 may become conductive, and signals may develop on a digit line 420 coupled with a memory cell 415, wherein the memory cell 415 is coupled with the transistor (e.g., where the transistor is a selection device for the memory cell). Additionally, the memory device may drive an activation signal through the signal line 430 using an activation signal driver 465. As described with reference to FIG. 3, the activation signal may reach sense amplifiers corresponding to different memory cells 415 along the word line 425 at different times (e.g., due to the signal line 430 being located in the memory array layer 405 and having similar properties to the word line 425). For example, a sense amplifier corresponding to a first memory cell 415 located along the first portion of the word line 425 may receive the activation signal at a third time and a sense amplifier corresponding to a second memory cell 415 located along the second portion of the word line 425 may receive the activation signal at a fourth time. The difference between the third time and fourth time may be known as a second delay. In some examples, the first delay may correspond to (e.g., be substantially the same as) the second delay. For example, the first delay and the second delay may be approximately equal in length (e.g., within an error threshold). In response to the activation signal, the sense amplifiers corresponding to the one or more memory cells 415 of the row of memory cells 415 may latch and the memory device may determine logic states stored at the one or more memory cells 415.

FIG. 4 illustrates one example of how a signal line 430 may be included in (e.g., fabricated in) the memory array layer 405 of a memory device to support a sensing scheme as described with reference to FIG. 3. As shown in FIG. 4, the signal line 430 may be located in the lower deck of the memory array layer 405 (e.g., the deck closest to the CuA layer 410) and may be positioned at the edge of the memory array (e.g., if viewed from above). The signal line 430 may not be coupled with any memory cells 415 or digit lines 420 of the memory array (or may be coupled with dummy memory cells but not with any digit lines 420). For example, digit lines 420 of the memory array may be cut before the signal line 430. For example, the signal line 430 and the set of word lines 425 may each extend in a first direction parallel to a substrate, and the set of digit lines 420 may each extend in a second direction parallel to the substrate, the second direction different from (e.g., perpendicular to) the first direction. The set of digit lines 420 may each extend across the set of word lines 425 but may terminate before reaching a plane that intersects the signal line 430, the plane perpendicular to the substrate. For example, as illustrated in the top view of the memory array layer 405, the plane may be in between the cross section 475 and the digit lines 420. As such, there may be no digit line contacts or memory cell contacts over the signal line 430.

Located below the signal line 430, in the CuA layer, may be sense amplifier circuitry 455. The signal line 430 may be coupled with sense amplifier circuitry 455 using conductive lines 440. In some cases, a conductive line 440 may be referred to as an interconnect. In some examples, the spacing and quantity of signal line contacts may correspond to the spacing and location of the digit lines 420 of the memory array. Further, the conductive lines 440 may connect the signal line 430 to the respective switch gate 460 (e.g., $SW_4$)—which may be an example of a switch 330-*b* as described with reference to FIG. 3—of each sense amplifier. For example, each interconnect of the set of interconnects may be coupled with a respective switch gate 460 for the respective sense amplifier of the set of sense amplifiers. During a sensing operation as described with reference to FIG. 3, the activation signal driver 465 may drive the activation signal through the signal line 430. As the activation signal propagates across the signal line 430, the activation signal may travel down conductive lines 440 (e.g., interconnects) to switch gates 460 of sense amplifiers corresponding to the one or more memory cells 415 and switch "on" the switch gates 460 in a sequential manner (e.g., according to the propagation delay of the activation signal along the signal line 430) such that the sense amplifiers may latch with different delays (e.g., at different respective times), which may align with the delays with which signal development occurs for different memory cells 415 coupled with the same activated word line 425.

Figure 5:
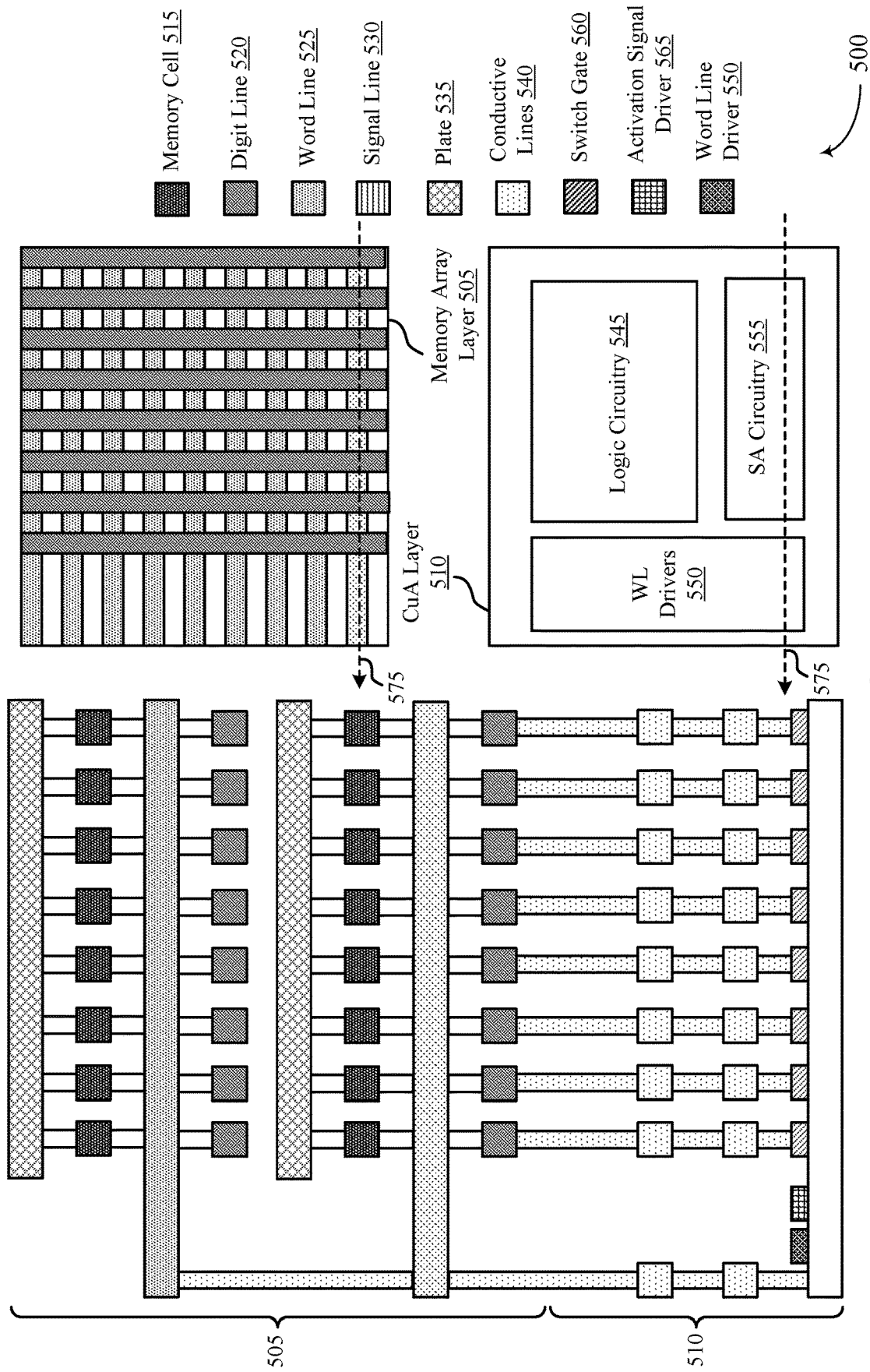

FIG. 5 illustrates an example of a memory device architecture 500 that supports sense timing coordination for memory in accordance with examples as disclosed herein. In some examples, the memory device architecture 500 may include or implement aspects of a system 100, a memory die 200, a sensing scheme 300, and a memory device architecture 400.

In some examples, a memory device may include multiple layers (or levels). For example, the memory device may include at least a memory array layer 505 and a CuA layer 510. The upper-right portion of FIG. 5 may show a top-down view of the memory array layer 505, while the lower-right portion of FIG. 5 may show a top-down view of the CuA layer 510. The left portion of FIG. 5 may show side views of the memory array layer 505 and the CuA layer 510 corresponding to cross sections 575.

The memory array layer 505 may include components associated with a memory array such as memory cells 515, digit lines 520, word lines 525, signal lines 530, and plates 535. A plate 535 may be an example of a plate line 220 or plate of one or more capacitors 240. FIG. 5 shows the plates 535 as each common to (e.g., coupled with each of) a set of memory cells 515 and as extending in a direction across the page. In some examples, the plates 535 may further extend in an additional direction into or out of the page and be common to additional memory cells that are coupled with additional word lines 525. In some examples, the digit lines 520 may run perpendicular to the word lines 525 and a memory cell 515 may be located at an intersection of a word line 525 and a digit line 520 (coupled with a respective word line 525 and a respective digit line 520). Moreover, the memory array layer 505 may include multiple memory arrays or decks stacked on top of one another. For example, the memory array layer 505 may include a first memory array and a second memory array, where each memory array has its own set of digit lines 520, word lines 525, and plates 535. The CuA layer 510 may include circuitry used to generate and convey signals or commands to the memory array layer 505. For example, the CuA layer 510 may include logic circuitry 545, word line drivers 550, and sense amplifier circuitry 555. More specifically, the CuA layer 510 may include switch gates 560, activation signal drivers 565, and word line drivers 550. A cross section 575 illustrates the different layers of the memory array taken from the signal line 530.

FIG. 5 illustrates one example of how a signal line 530 may be included in (e.g., fabricated in) the memory array layer 505 of a memory device to support a sensing scheme as described with reference to FIG. 3. As shown in FIG. 5, the signal line 530 may be located in the lower deck of the memory array layer 505 (e.g., the deck closest to the CuA layer 510) and may be positioned at the edge of the memory array. The signal line 530 may be coupled with memory cells 515 (e.g., dummy memory cells) and—in some cases—digit lines 520 of the memory array. That is, the digit lines 520 of the memory array may extend across the signal line 530. As such, there may be digit line contacts and memory cell contacts over the signal line 530. Located below the signal line 530, in the CuA layer 510, may be sense amplifier circuitry 555. The signal line 530 may be coupled with sense amplifier circuitry 555 using conductive lines 540 (e.g., interconnects). In some examples, the conductive lines 540 may couple with the signal line 530 using self-aligned contacts (SAC) in between digit lines 520. For example, the conductive lines 540 may be coupled with the signal line 530 using a SAC process, in which a protective dielectric layer may be added over a transistor gate to prevent contact-to-gate shorts. Further, the conductive lines 540 may connect the signal line 530 to the respective switch gate 560 (e.g., $SW_4$)—which may be an example of a switch 330-b as described with reference to FIG. 3—of each sense amplifier. During a sensing operation as described with reference to FIG. 3, the activation signal driver 565 may drive the activation signal through the signal line 530. As the activation signal propagates across the signal line 530, the activation signal may travel down conductive lines 540 (e.g., interconnects) to switch gates 560 of sense amplifiers corresponding to memory cells 515 and switch "on" the switch gates 560 in a sequential manner such that the sense amplifiers may latch with different delays (e.g., at different respective times), which may align with the delays with which signal development occurs for different memory cells 515 coupled with the same activated word line 525.

For example, as described herein, the memory device may include a set of sense amplifiers each corresponding to a respective digit line 520 of a set of digit lines 520 and configured to sense one or more memory cells 515 within a respective column (e.g., corresponding to a respective digit line 520) of the memory array. The one or more memory cells 515 within the respective column may be couplable with the respective digit line 520. The memory device may further include a word line 525 coupled with a set of memory cells 515 within a row of the memory array. Each digit line 520 of the set of digit lines 520 may be couplable with a respective memory cell 515 of the set of memory cells 515 in the row. The memory device may further include a signal line 530 coupled with the set of sense amplifiers (e.g., included in the sense amplifier circuitry 555) by a set of interconnects (e.g., conductive lines 540) each corresponding to a respective sense amplifier of the set of sense amplifiers. The signal line 530 may be configured to carry an activation signal, where each sense amplifier of the set of sense amplifiers may be configured to be activated based on the activation signal reaching the sense amplifier over a respective interconnect (e.g., conductive line 540) of the set of interconnects. The signal line 530 and a set of word lines 525 including the word line 525 may each extend in a first direction parallel to a substrate. The set of digit lines 520 may each extend in a second direction parallel to the substrate, the second direction different from (e.g., perpendicular to) the first direction. As illustrated in FIG. 5, the set of digit lines 520 may each extend across the set of word lines 525 and across the signal line 530, where one or more interconnects of the set of interconnects are coupled with the signal line 530 between digit lines 520 of the set of digit lines 520. For example, the one or more interconnects (e.g., conductive lines 540) may be coupled with the signal line 530 between the digit lines 520 of the set of digit lines 520 based on a SAC process (e.g., fabricated using a SAC process).

Figure 6:
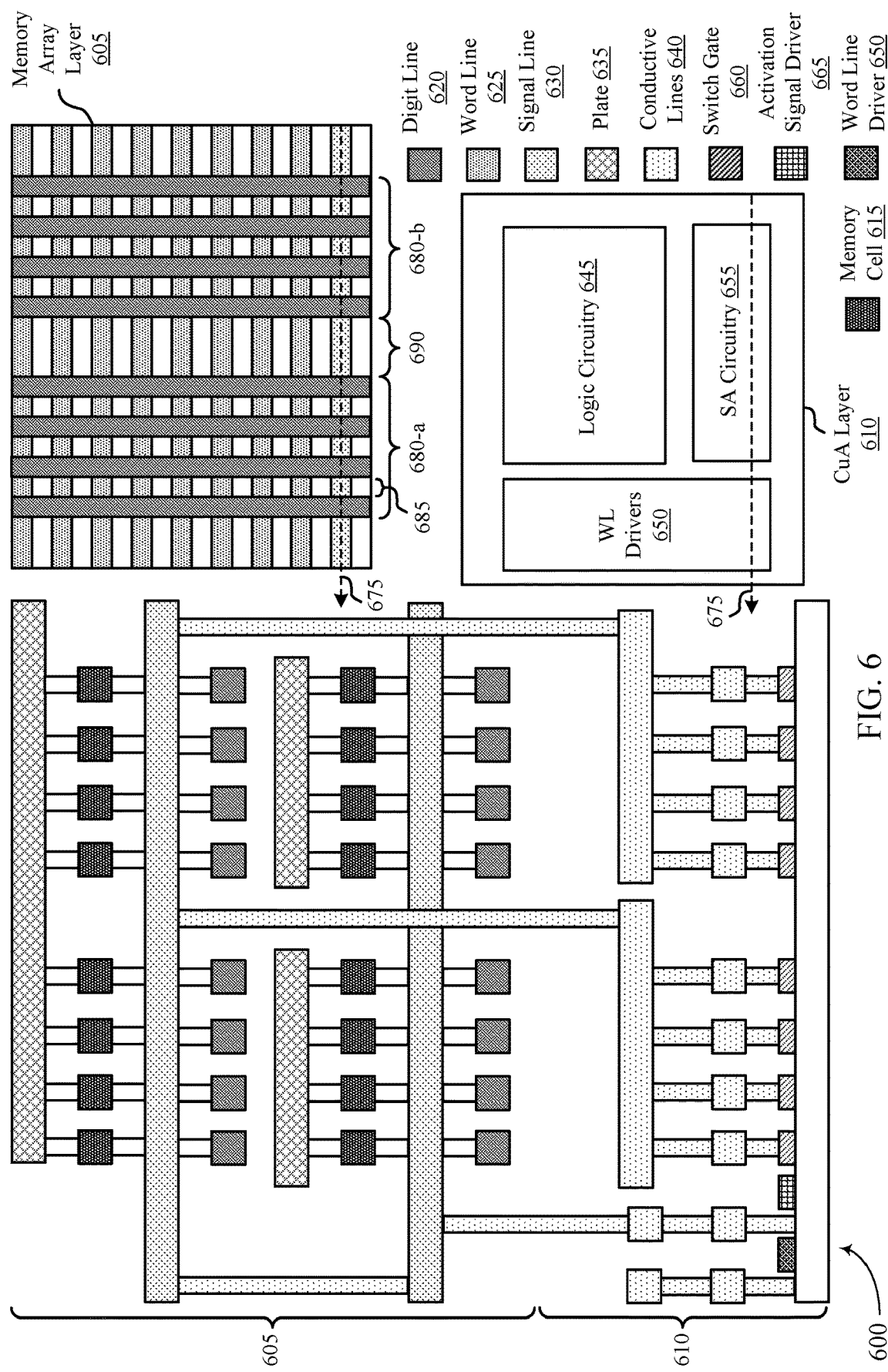

FIG. 6 illustrates an example of a memory device architecture 600 that supports sense timing coordination for memory in accordance with examples as disclosed herein. In some examples, the memory device architecture 600 may include or implement aspects of a system 100, a memory die 200, a sensing scheme 300, a memory device architecture 400, and a memory device architecture 500.

In some examples, a memory device may include multiple layers (or levels). For example, the memory device may include at least a memory array layer 605 and a CuA layer 610. The upper-right portion of FIG. 6 may show a top-down view of the memory array layer 605, while the lower-right portion of FIG. 6 may show a top-down view of the CuA layer 610. The left portion of FIG. 6 may show side views of the memory array layer 605 and the CuA layer 610 corresponding to cross sections 675.

The memory array layer 605 may include components associated with a memory array such as memory cells 615, digit lines 620, word lines 625, signal lines 630, and plates 635. A plate 635 may be an example of a plate line 220 or plate of one or more capacitors 240. FIG. 6 shows the plates 635 as each common to (e.g., coupled with each of) a set of memory cells 615 and as extending in a direction across the page. In some examples, the plates 635 may further extend in an additional direction into or out of the page and be common to additional memory cells that are coupled with additional word lines 625. In some examples, the digit lines 620 may run perpendicular to the word lines 625 and a memory cell 615 may be located at an intersection of a word line 625 and a digit line 620 (coupled with a respective word line 625 and a respective digit line 620). Moreover, the memory array layer 605 may include multiple memory arrays or decks stacked on top of one another. For example, the memory array layer 605 may include a first memory array and a second memory array, where each memory array has its own set of digit lines 620, word lines 625, and plates 635. The CuA layer 610 may include circuitry used to generate and convey signals or commands to the memory array layer 605. For example, the CuA layer 610 may include logic circuitry 645, word line drivers 650, and sense amplifier circuitry 655. More specifically, the CuA layer 610 may include switch gates 660, activation signal drivers 665, and word line drivers 650. A cross section 675 illustrates the different layers of the memory array taken from the signal lines 630.

FIG. 6 illustrates one example of how signal lines 630 may be included in (e.g., fabricated in) the memory array layer 605 of a memory device to support a sensing scheme as described with reference to FIG. 3. As shown in FIG. 6, a signal line 630 may be located in the lower deck of the memory array layer 605 (e.g., a deck closest to the CuA layer 610), a signal line 630 may be located in the upper deck of the memory array layer 605, or a set of signal lines 630 may be located in multiple decks of the memory array layer 605. The signal lines 630 may be positioned at the edge of the memory array and may be coupled with memory cells 615 (e.g., dummy memory cells) and—in some cases—digit lines 620 of the memory array. That is, the digit lines 620 of the memory array may run through the signal lines 630 and there may be digit line contacts and memory cell contacts over the signal lines 630. Located below the signal lines 630, in the CuA layer 610, may be sense amplifier circuitry 655. In some examples, one or more digit lines 620 may be removed from (or otherwise not included in) the memory array such that at least one signal line 630 may connect to sense amplifier circuitry 655. For example, the memory array may be designed such that digit lines 620 may be removed (e.g., not included) according to a pattern or periodicity (e.g., for every four digit lines, one digit line may be replaced with an interconnect). Additionally, at least one deck of the memory array layer 605 (e.g., the lower deck) may include a greater quantity of separate plates 635 than at least one other deck of the memory array layer 605 (e.g., the upper deck), where a gap between adjacent plates 635 within the at least one deck may accommodate one or more conductive lines 640 (e.g., the one or more conductive lines 640 may extend through the gap).

At least one of the signals lines 630 may be coupled with sense amplifier circuitry 655 using conductive lines 640. In some examples, the conductive lines 640 may be positioned in the spaces created by the removal (or otherwise non-inclusion) of the one or more digit lines (e.g., the gaps 690) and the gaps between separate plates 635 to connect a signal line 630 to one or more sense amplifiers of the sense amplifier circuitry 655. For example, the conductive lines 640 (e.g., interconnects) may connect the signal line 630 to the respective switch gate 660 (e.g., SW$_4$)—which may be an example of a switch 330-b as described with reference to FIG. 3—of each sense amplifier. During a sensing operation as described with reference to FIG. 3, the activation signal driver 665 may drive the activation signal through the signal line 630. The activation signal may propagate across at least one of the signal lines 630 and travel down conductive lines 640 to switch gates 660 of sense amplifiers corresponding to at least one row of memory cells 615 and switch "on" the switch gates 660 in a sequential manner such that the sense amplifier may latch with different delays (e.g., at different respective times), which may align with the delays with which signal development occurs for different memory cells 615 coupled with the same activated word line 625. For example, as shown in FIG. 6, the activation signal may travel through the signal line 630 of the upper deck and travel down conductive lines 640 to switch gates 660 of a first subset of sense amplifiers corresponding to the row of memory cells. Additionally, the activation signal may also travel through the signal line 630 of the upper deck and down conductive lines 640 to switch gates 660 of a second subset of sense amplifiers.

For example, as described herein, a memory device may include a set of sense amplifiers in sense amplifier circuitry 655, each sense amplifier corresponding to a respective digit line 620 and configured to sense one or more memory cells 615 within a respective column of the memory array. The one or more memory cells 615 within the respective column may be couplable with the respective digit line 620. The memory device may further include a word line 625 coupled with a first subset of memory cells 615 within a row of the memory array and a second subset of memory cells 615 within the row of the memory array. Each digit line 620 of a first subset of digit lines 680-a may be couplable with a respective memory cell 615 of the first subset of memory cells 615, and each digit line 620 of a second subset of digit lines 680-b may be couplable with a respective memory cell 615 of the second subset of memory cells 615. The digit lines 620 of the first subset of digit lines 680-a may be separated by first gaps 685 of a first width, and digit lines 620 of the second subset of digit lines 680-b may be separated by second gaps 685 of the first width. For example, the first width may correspond to a common gap size between subsequent digit lines 620. However, the first subset of digit lines 680-a may be separated from the second subset of digit lines 680-b by a third gap 690 of a second width larger than the first width. The second width may correspond to an additional gap size created by not including a digit line in the memory array (e.g., to provide space for an interconnect, such as a conductive line 640, from a signal line 630 in an upper deck to the sense amplifier circuitry 655).

Additionally, the memory device may include a signal line 630 coupled with the set of sense amplifiers by a first interconnect (e.g., a first conductive line 640) and a second interconnect (e.g., a second conductive line 640). The memory array may be designed such that a relatively larger gap 690 is included after every group of digit lines 620 of some quantity (e.g., every four digit lines 620). Accordingly, as one example, if the memory array includes twelve digit lines 620, the first interconnect may be located between the fourth and fifth digit lines 620 (as illustrated), and the second interconnect may be located between the eighth and ninth digit lines 620 (where the ninth digit line is not shown). The memory device may include any quantity of interconnects based on the quantity of digit lines 620 and the quantity of gaps 690 included between subsets of digit lines 680. The first interconnect may be coupled with a portion of the signal line 630 that is aligned with the gap 690 of the second width between the first subset of digit lines 680-a and the second subset of digit lines 680-b. In some examples, the first interconnect may correspond to each sense amplifier of a first subset of sense amplifiers that are coupled with respective digit lines 620 of the first subset of digit lines 680-a. The second interconnect may correspond to each sense amplifier of a second subset of sense amplifiers coupled with respective digit lines 620 of the second subset of digit lines 680-b. The signal line 630 may be configured to carry an activation signal, where each sense amplifier of the set of sense amplifiers may be configured to be activated based on the activation signal reaching the sense amplifier over an interconnect (e.g., the first interconnect or the second interconnect). In some cases, the memory device may further include a first plate (e.g., a first plate 635) coupled with the first subset of memory cells 615 and a second plate (e.g., a second plate 635) coupled with the second subset of memory cells 615, where the first interconnect (e.g., the first conductive line 640) may extend between the first plate and the second plate (e.g., through the gap 690).

Figure 7:
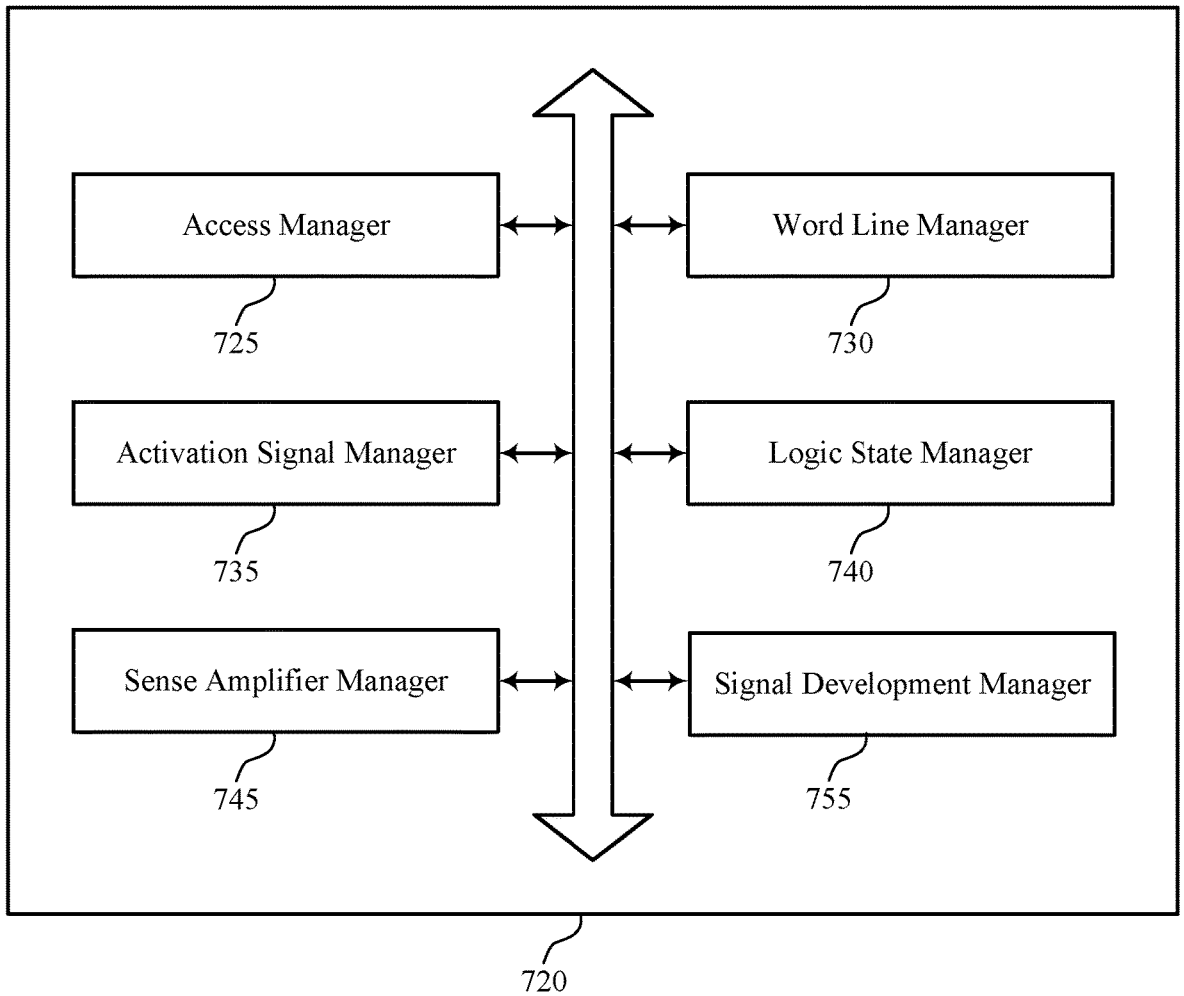
FIG. 7 shows a block diagram of a memory device that supports sense timing coordination for memory in accordance with examples as disclosed herein.

FIG. 7 shows a block diagram 700 of a memory device 720 that supports sense timing coordination for memory in accordance with examples as disclosed herein. The memory device 720 may be an example of aspects of a memory device as described with reference to FIGS. 1 through 6. The memory device 720, or various components thereof, may be an example of means for performing various aspects of sense timing coordination for memory as described herein. For example, the memory device 720 may include an access manager 725, a word line manager 730, an activation signal manager 735, a logic state manager 740, a sense amplifier manager 745, a signal development manager 755, or any combination thereof. Each of these components may communicate, directly or indirectly, with one another (e.g., via one or more buses).

The access manager 725 may be configured as or otherwise support a means for determining a memory cell to access, the memory cell coupled with a word line and at a memory array level of a memory device 720. The word line manager 730 may be configured as or otherwise support a means for activating the word line coupled with the determined memory cell. The activation signal manager 735 may be configured as or otherwise support a means for generating an activation signal for a sense amplifier based at least in part on determining the memory cell to access, the activation signal routed to the sense amplifier over a signal line located at the memory array level of the memory device. The logic state manager 740 may be configured as or otherwise support a means for sensing, at the sense amplifier, a state of the memory cell in response to the activation signal and based at least in part on activating the word line.

In some examples, the memory cell is in a row with one or more additional memory cells at the memory array level of the memory device, the one or more additional memory cells further coupled with the word line. In some such examples, the logic state manager 740 may be configured as or otherwise support a means for sensing, at one or more additional sense amplifiers, respective states of the one or more additional memory cells in response to the activation signal and based at least in part on activating the word line.

In some examples, the sense amplifier senses the state of the memory cell at a first time based at least in part on a first distance traveled by the activation signal on the signal line from a source of the activation signal to the sense amplifier. In some such examples, an additional sense amplifier of the one or more additional sense amplifiers senses a respective state of an additional memory cell of the one or more additional memory cells at a second time different from the first time based at least in part on a second distance traveled by the activation signal on the signal line from the source of the activation signal to the additional sense amplifier, the second distance different from the first distance.

In some examples, the signal development manager 755 may be configured as or otherwise support a means for developing a signal on a digit line based at least in part on a voltage of a first portion of the word line reaching a threshold voltage at a third time in response to activating the word line, where the memory cell is coupled with the first portion of the word line, and where sensing the state of the memory cell is based at least in part on the signal on the digit line. In some such examples, the signal development manager 755 may be configured as or otherwise support a means for developing an additional signal on an additional digit line based at least in part on the voltage of a second portion of the word line reaching the threshold voltage at a fourth time in response to activating the word line, where the additional memory cell is coupled with the second portion of the word line, and where sensing the respective state of the additional memory cell is based at least in part on the additional signal on the additional digit line.

In some examples, a first propagation delay between the second time and the first time and associated with the signal line corresponds to a second propagation delay between the fourth time and the third time and associated with the word line. In some examples, the first propagation delay corresponds to the second propagation delay based at least in part on the signal line and the word line sharing a conductive property.

In some examples, the sense amplifier is located at a CuA level of the memory device 720 different from the memory array level of the memory device 720. In some examples, the signal line may be an example of a dummy word line.

Additionally or alternatively, in some examples, the word line manager 730 may be configured as or otherwise support a means for activating a word line based at least in part on an access operation for a first memory cell and a second memory cell, the word line coupled with the first memory cell and the second memory cell. In some examples, the activation signal manager 735 may be configured as or otherwise support a means for routing, based at least in part on the access operation, an activation signal to a first sense amplifier and a second sense amplifier using a signal line. The sense amplifier manager 745 may be configured as or otherwise support a means for activating the first sense amplifier to sense a first state of the first memory cell at a first time based at least in part on a first portion of the signal line reaching a threshold voltage at the first time, the first portion of the signal line coupled with the first sense amplifier. In some examples, the sense amplifier manager 745 may additionally be configured as or otherwise support a means for activating the second sense amplifier to sense a second state of the second memory cell at a second time different from the first time based at least in part on a second portion of the signal line reaching the threshold voltage at the second time, the second portion of the signal line coupled with the second sense amplifier.

In some examples, the logic state manager 740 may be configured as or otherwise support a means for determining the first state of the first memory cell based at least in part on activating the word line coupled with the first memory cell and activating the first sense amplifier. In some examples, the logic state manager 740 may be configured as or otherwise support a means for determining the second state of the second memory cell based at least in part on activating the word line coupled with the second memory cell and activating the second sense amplifier.

In some examples, the first sense amplifier is activated at the first time and the second sense amplifier is activated at the second time based at least in part on a propagation delay of the activation signal over the signal line. In some examples, the signal development manager 755 may be configured as or otherwise support a means for developing a first signal on a first digit line based at least in part on a first portion of the word line reaching a second threshold voltage at a third time in response to activating the word line, where the first memory cell is coupled with the first portion of the word line, and where sensing the first state of the first memory cell is based at least in part on the first signal on the first digit line. In some such examples, the signal development manager 755 may be configured as or otherwise support a means for developing a second signal on a second digit line based at least in part on a second portion of the word line reaching the second threshold voltage at a fourth time different from the third time in response to activating the word line, where the second memory cell is coupled with the second portion of the word line, where sensing the second state of the second memory cell is based at least in part on the second signal on the second digit line, and where the first signal is developed on the first digit line at the third time and the second signal is developed on the second digit line at the fourth time based at least in part on a second propagation delay of a third signal over the word line. In some examples, the propagation delay of the activation signal over the signal line corresponds to the second propagation delay of the third signal over the word line.

Figure 8:
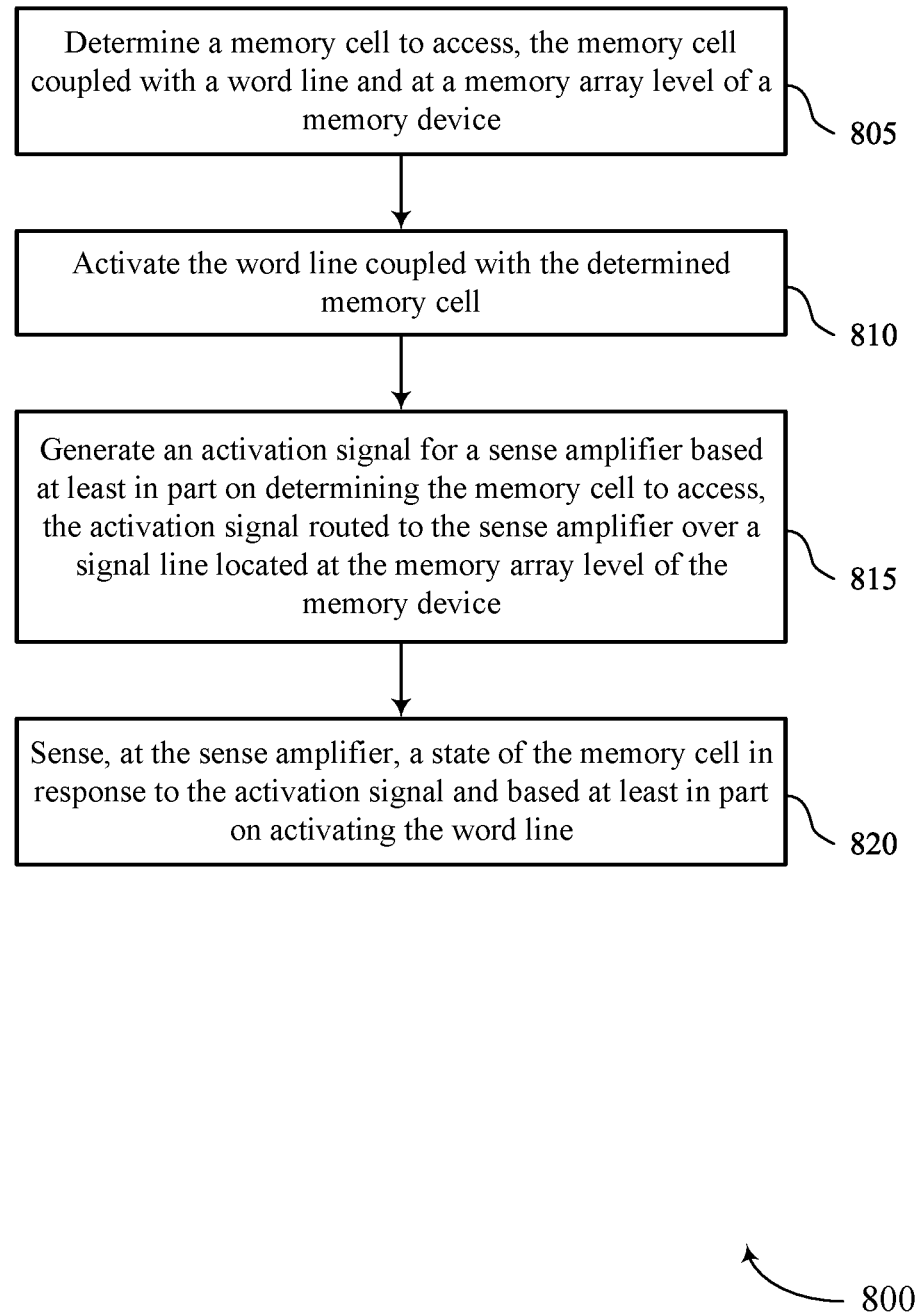
FIGS. 8 and 9 show flowcharts illustrating methods that support sense timing coordination for memory in accordance with examples as disclosed herein.

FIG. 8 shows a flowchart illustrating a method 800 that supports sense timing coordination for memory in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include determining a memory cell to access, the memory cell coupled with a word line and at a memory array level of a memory device. The operations of 805 may be performed in accordance with examples as disclosed herein. In some examples, aspects of the operations of 805 may be performed by an access manager 725 as described with reference to FIG. 7.

At 810, the method may include activating the word line coupled with the determined memory cell. The operations of 810 may be performed in accordance with examples as disclosed herein. In some examples, aspects of the operations of 810 may be performed by a word line manager 730 as described with reference to FIG. 7.

At 815, the method may include generating an activation signal for a sense amplifier based at least in part on determining the memory cell to access, the activation signal routed to the sense amplifier over a signal line located at the memory array level of the memory device. The operations of 815 may be performed in accordance with examples as disclosed herein. In some examples, aspects of the operations of 815 may be performed by an activation signal manager 735 as described with reference to FIG. 7.

At 820, the method may include sensing, at the sense amplifier, a state of the memory cell in response to the activation signal and based at least in part on activating the word line. The operations of 820 may be performed in accordance with examples as disclosed herein. In some examples, aspects of the operations of 820 may be performed by a logic state manager 740 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor) for determining a memory cell to access, the memory cell coupled with a word line and at a memory array level of a memory device, activating the word line coupled with the determined memory cell, generating an activation signal for a sense amplifier based at least in part on determining the memory cell to access, the activation signal routed to the sense amplifier over a signal line located at the memory array level of the memory device, and sensing, at the sense amplifier, a state of the memory cell in response to the activation signal and based at least in part on activating the word line.

In some examples of the method 800 and the apparatus described herein, the memory cell may be in a row with one or more additional memory cells at the memory array level of the memory device, where the one or more additional memory cells are further coupled with the word line. Some examples of the method 800 and the apparatus described herein may further include operations, features, circuitry, logic, means, or instructions for sensing, at one or more additional sense amplifiers, respective states of the one or more additional memory cells in response to the activation signal and based at least in part on activating the word line.

In some examples of the method 800 and the apparatus described herein, the sense amplifier senses the state of the memory cell at a first time based at least in part on a first distance traveled by the activation signal on the signal line from a source of the activation signal to the sense amplifier, and an additional sense amplifier of the one or more additional sense amplifiers senses a respective state of an additional memory cell of the one or more additional memory cells at a second time different from the first time based at least in part on a second distance traveled by the activation signal on the signal line from the source of the activation signal to the additional sense amplifier, the second distance different from the first distance.

Some examples of the method 800 and the apparatus described herein may further include operations, features, circuitry, logic, means, or instructions for developing a signal on a digit line based at least in part on a voltage of a first portion of the word line reaching a threshold voltage at a third time in response to activating the word line, where the memory cell may be coupled with the first portion of the word line, and where sensing the state of the memory cell may be based at least in part on the signal on the digit line. Some such examples of the method 800 and the apparatus described herein may further include operations, features, circuitry, logic, means, or instructions for developing an additional signal on an additional digit line based at least in part on the voltage of a second portion of the word line reaching the threshold voltage at a fourth time in response to activating the word line, where the additional memory cell may be coupled with the second portion of the word line, and where sensing the respective state of the additional memory cell may be based at least in part on the additional signal on the additional digit line.

In some examples of the method 800 and the apparatus described herein, a first propagation delay between the second time and the first time and associated with the signal line corresponds to a second propagation delay between the fourth time and the third time and associated with the word line.

In some examples of the method 800 and the apparatus described herein, the first propagation delay corresponds to the second propagation delay based at least in part on the signal line and the word line sharing a conductive property.

In some examples of the method 800 and the apparatus described herein, the sense amplifier may be located at a CuA level of the memory device different from the memory array level of the memory device.

In some examples of the method 800 and the apparatus described herein, the signal line may be an example of a dummy word line.

Figure 9:
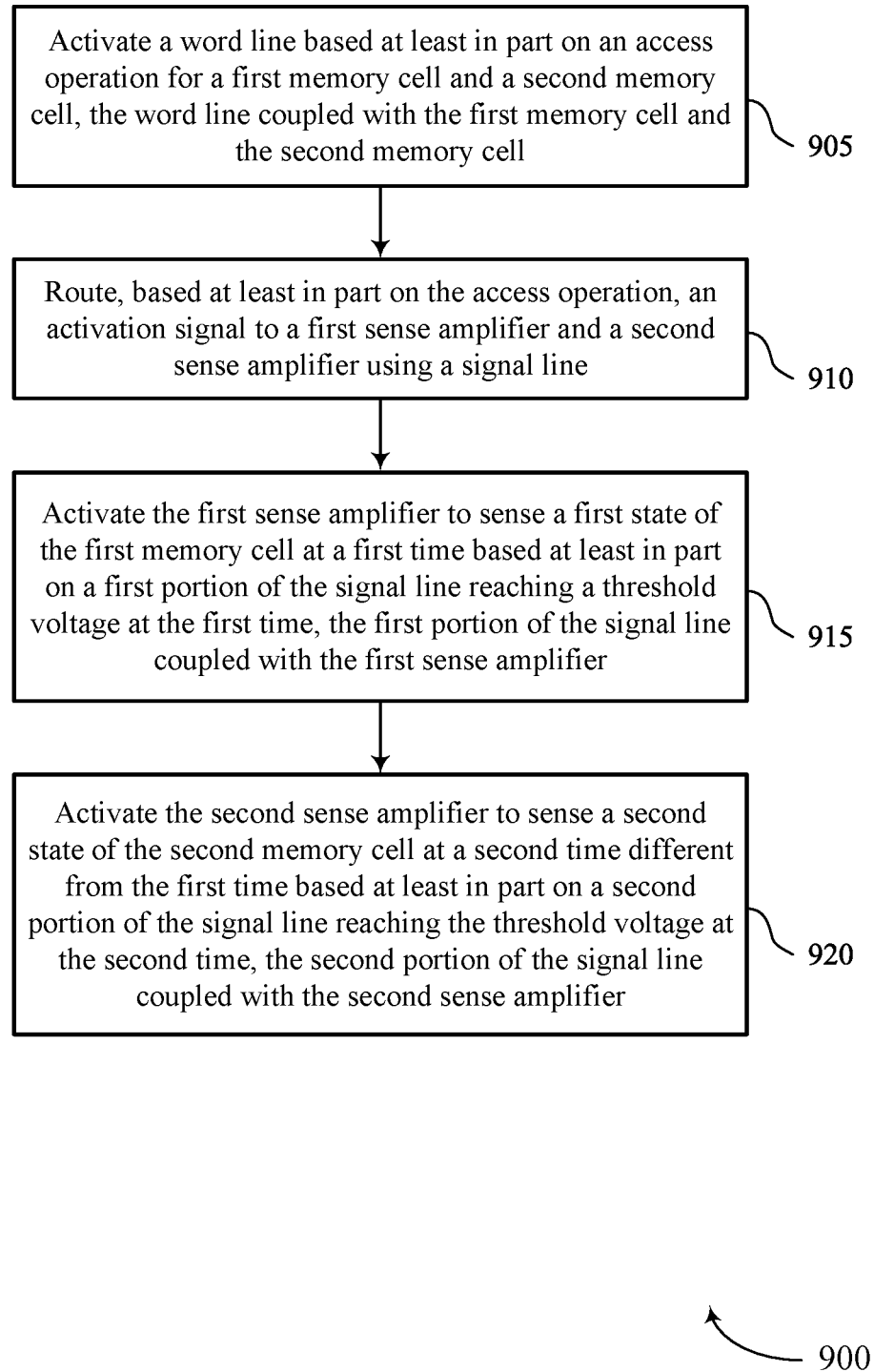

FIG. 9 shows a flowchart illustrating a method 900 that supports sense timing coordination for memory in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally or alternatively, the memory device may perform aspects of the described functions using special-purpose hardware.

At 905, the method may include activating a word line based at least in part on an access operation for a first memory cell and a second memory cell, the word line coupled with the first memory cell and the second memory cell. The operations of 905 may be performed in accordance with examples as disclosed herein. In some examples, aspects of the operations of 905 may be performed by a word line manager 730 as described with reference to FIG. 7.

At 910, the method may include routing, based at least in part on the access operation, an activation signal to a first sense amplifier and a second sense amplifier using a signal line. The operations of 910 may be performed in accordance with examples as disclosed herein. In some examples, aspects of the operations of 910 may be performed by an activation signal manager 735 as described with reference to FIG. 7.

At 915, the method may include activating the first sense amplifier to sense a first state of the first memory cell at a first time based at least in part on a first portion of the signal line reaching a threshold voltage at the first time, the first portion of the signal line coupled with the first sense amplifier. The operations of 915 may be performed in accordance with examples as disclosed herein. In some examples, aspects of the operations of 915 may be performed by a sense amplifier manager 745 as described with reference to FIG. 7.

At 920, the method may include activating the second sense amplifier to sense a second state of the second memory cell at a second time different from the first time based at least in part on a second portion of the signal line reaching the threshold voltage at the second time, the second portion of the signal line coupled with the second sense amplifier. The operations of 920 may be performed in accordance with examples as disclosed herein. In some examples, aspects of the operations of 920 may be performed by a sense amplifier manager 745 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for activating a word line based at least in part on an access operation for a first memory cell and a second memory cell, the word line coupled with the first memory cell and the second memory cell, routing, based at least in part on the access operation, an activation signal to a first sense amplifier and a second sense amplifier using a signal line, activating the first sense amplifier to sense a first state of the first memory cell at a first time based at least in part on a first portion of the signal line reaching a threshold voltage at the first time, the first portion of the signal line coupled with the first sense amplifier, and activating the second sense amplifier to sense a second state of the second memory cell at a second time different from the first time based at least in part on a second portion of the signal line reaching the threshold voltage at the second time, the second portion of the signal line coupled with the second sense amplifier.

Some examples of the method 900 and the apparatus described herein may further include operations, features, circuitry, logic, means, or instructions for determining the first state of the first memory cell based at least in part on activating the word line coupled with the first memory cell and activating the first sense amplifier and determining the second state of the second memory cell based at least in part on activating the word line coupled with the second memory cell and activating the second sense amplifier.

In some examples of the method 900 and the apparatus described herein, the first sense amplifier may be activated at the first time and the second sense amplifier may be activated at the second time based at least in part on a propagation delay of the activation signal over the signal line.

Some examples of the method 900 and the apparatus described herein may further include operations, features, circuitry, logic, means, or instructions for developing a first signal on a first digit line based at least in part on a first portion of the word line reaching a second threshold voltage at a third time in response to activating the word line, where the first memory cell may be coupled with the first portion of the word line, and where sensing the first state of the first memory cell may be based at least in part on the first signal on the first digit line. Some such examples of the method 900 and the apparatus described herein may further include operations, features, circuitry, logic, means, or instructions for developing a second signal on a second digit line based at least in part on a second portion of the word line reaching the second threshold voltage at a fourth time different from the third time in response to activating the word line, where the second memory cell may be coupled with the second portion of the word line, where sensing the second state of the second memory cell may be based at least in part on the second signal on the second digit line, and where the first signal may be developed on the first digit line at the third time and the second signal may be developed on the second digit line at the fourth time based at least in part on a second propagation delay of a third signal over the word line.

In some examples of the method 900 and the apparatus described herein, the propagation delay of the activation signal over the signal line corresponds to the second propagation delay of the third signal over the word line.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a word line coupled with a memory cell of a memory device, the word line located at a memory array level of the memory device, and a signal line coupled with a sense amplifier, the signal line located at the memory array level of the memory device, and the signal line configured to carry an activation signal for the sense amplifier. The apparatus may further include the sense amplifier configured to sense a state of the memory cell in response to the activation signal and based at least in part on an activation of the word line coupled with the memory cell.

In some examples, the apparatus may further include one or more additional sense amplifiers, where the signal line may be further coupled with the one or more additional sense amplifiers, and where the one or more additional sense amplifiers may be configured to sense respective states of one or more respective additional memory cells in response to the activation signal.

In some examples of the apparatus, the sense amplifier may be configured to sense the state of the memory cell at a first time based at least in part on a first propagation delay between a source of the activation signal and the sense amplifier, and at least one additional sense amplifier of the one or more additional sense amplifiers may be configured to sense a respective state of a respective additional memory cell at a second time different from the first time based at least in part on a second propagation delay between the source of the activation signal and the at least one additional sense amplifier.

In some examples of the apparatus, the word line may be further coupled with the one or more respective additional memory cells of the memory device, the memory cell and the one or more respective additional memory cells each within a row of a memory array at the memory array level of the memory device, and the one or more additional sense amplifiers may be configured to sense the respective states of the one or more respective additional memory cells further based at least in part on the activation of the word line coupled with the one or more respective additional memory cells.

In some examples, the apparatus may further include a transistor of the memory cell configured to become conductive in response to a voltage at a first portion of the word line reaching a threshold voltage at a third time based at least in part on the activation of the word line, the sense amplifier configured to sense the state of the memory cell based at least in part on the transistor becoming conductive. In some such examples, the apparatus may further include an additional transistor of the respective additional memory cell configured to become conductive in response to the voltage at a second portion of the word line reaching the threshold voltage at a fourth time different from the third time based at least in part on the activation of the word line, the at least one additional sense amplifier configured to sense the respective state of the respective additional memory cell based at least in part on the additional transistor becoming conductive.

In some examples of the apparatus, a first delay between the second time and the first time corresponds to a second delay between the fourth time and the third time based at least in part on the signal line and the word line sharing one or more properties. In some examples of the apparatus, a third delay between the third time and the first time corresponds to a fourth delay between the fourth time and the second time based at least in part on the signal line and the word line sharing one or more properties.

In some examples, the apparatus may include a substrate, where the word line and the signal line may be equidistant from the substrate. In some examples, the apparatus may further include a digit line coupled with the sense amplifier and the memory cell, where the sense amplifier may be configured to sense the state of the memory cell based at least in part on a signal carried by the digit line.

In some examples of the apparatus, the sense amplifier may be located at a CuA level of the memory device, the CuA level different from the memory array level.

In some examples of the apparatus, the signal line runs parallel to the word line at the memory array level of the memory device. In some examples of the apparatus, the signal line and the word line both include a same material. In some examples of the apparatus, the signal line and the word line both may have a same cross-sectional area.

In some examples of the apparatus, the signal line may be an example of a dummy word line. In some examples of the apparatus, the dummy word line may be coupled with a dummy memory cell of the memory device.

Another apparatus is described. The apparatus may include a plurality of sense amplifiers each corresponding to a respective digit line of a plurality of digit lines and configured to sense one or more memory cells within a respective column of a memory array, the one or more memory cells within the respective column couplable with the respective digit line. The apparatus may further include a word line coupled with a plurality of memory cells within a row of the memory array, each digit line of the plurality of digit lines couplable with a respective memory cell of the plurality of memory cells, and a signal line coupled with the plurality of sense amplifiers by a plurality of interconnects each corresponding to a respective sense amplifier of the plurality of sense amplifiers, where the signal line is configured to carry an activation signal, and where each sense amplifier of the plurality of sense amplifiers is configured to be activated based at least in part on the activation signal reaching the sense amplifier over a respective interconnect of the plurality of interconnects.

In some examples of the apparatus, the signal line and a plurality of word lines each extend in a first direction parallel to a substrate, the plurality of word lines including the word line, the plurality of digit lines each extend in a second direction parallel to the substrate, the second direction different from the first direction, and the plurality of digit lines each extend across the plurality of word lines and terminate before reaching a plane that intersects the signal line, the plane perpendicular to the substrate.

In some examples of the apparatus, the signal line and a plurality of word lines each extend in a first direction parallel to a substrate, the plurality of word lines including the word line, the plurality of digit lines each extend in a second direction parallel to the substrate, the second direction different from the first direction, and the plurality of digit lines each extend across the plurality of word lines and across the signal line, where one or more interconnects of the plurality of interconnects may be coupled with the signal line between digit lines of the plurality of digit lines.

In some examples of the apparatus, the one or more interconnects may be coupled with the signal line between the digit lines of the plurality of digit lines based at least in part on a SAC process.

In some examples of the apparatus, each interconnect of the plurality of interconnects may be coupled with a respective switch gate for the respective sense amplifier of the plurality of sense amplifiers.

Another apparatus is described. The apparatus may include a plurality of sense amplifiers each corresponding to a respective digit line and configured to sense one or more memory cells within a respective column of a memory array, the one or more memory cells within the respective column couplable with the respective digit line. The apparatus may further include a word line coupled with a first subset of memory cells within a row of the memory array and a second subset of memory cells within the row of the memory array, each digit line of a first subset of digit lines couplable with a respective memory cell of the first subset of memory cells and each digit line of a second subset of digit lines couplable with a respective memory cell of the second subset of memory cells, where digit lines of the first subset of digit lines are separated by first gaps of a first width, digit lines of the second subset of digit lines are separated by second gaps of the first width, and the first subset of digit lines is separated from the second subset of digit lines by a third gap of a second width larger than the first width. The apparatus may further include a signal line coupled with the plurality of sense amplifiers by a first interconnect and a second interconnect, the first interconnect coupled with a portion of the signal line that is aligned with the third gap of the second width between the first subset of digit lines and the second subset of digit lines, where the first interconnect corresponds to each sense amplifier of a first subset of sense amplifiers that are coupled with respective digit lines of the first subset of digit lines, the second interconnect corresponds to each sense amplifier of a second subset of sense amplifiers coupled with respective digit lines of the second subset of digit lines, and the signal line is configured to carry an activation signal, each sense amplifier of the plurality of sense amplifiers configured to be activated based at least in part on the activation signal reaching the sense amplifier over the first interconnect or the second interconnect.

In some examples, the apparatus may further include a first plate coupled with the first subset of memory cells and a second plate coupled with the second subset of memory cells, where the first interconnect extends between the first plate and the second plate.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "level" used herein may refer to a conceptual grouping of components. Layers or levels may include different elements, components, or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or technologies such as infrared, radio, and microwave, then the coaxial cable, fiber optic cable, twisted pair, digital subscriber line (DSL), or technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a word line coupled with a memory cell of a memory device, the word line located at a memory array level of the memory device;
   a signal line coupled with a sense amplifier, the signal line located at the memory array level of the memory device and running parallel to the word line at the memory array level of the memory device, and the signal line configured to carry an activation signal for the sense amplifier;
   the sense amplifier configured to sense a state of the memory cell in response to the activation signal and based at least in part on an activation of the word line coupled with the memory cell; and
   a digit line coupled with the sense amplifier and the memory cell.

2. The apparatus of claim 1, further comprising:
   one or more additional sense amplifiers, wherein the signal line is further coupled with the one or more additional sense amplifiers, and wherein the one or more additional sense amplifiers are configured to sense respective states of one or more respective additional memory cells in response to the activation signal.

3. The apparatus of claim 2, wherein:
   the sense amplifier is configured to sense the state of the memory cell at a first time based at least in part on a first propagation delay between a source of the activation signal and the sense amplifier; and
   at least one additional sense amplifier of the one or more additional sense amplifiers is configured to sense a respective state of a respective additional memory cell at a second time different from the first time based at least in part on a second propagation delay between the source of the activation signal and the at least one additional sense amplifier.

4. The apparatus of claim 3, wherein:
the word line is further coupled with the one or more respective additional memory cells of the memory device, the memory cell and the one or more respective additional memory cells each within a row of a memory array at the memory array level of the memory device; and
the one or more additional sense amplifiers are configured to sense the respective states of the one or more respective additional memory cells further based at least in part on the activation of the word line coupled with the one or more respective additional memory cells.

5. The apparatus of claim 4, further comprising:
a transistor of the memory cell configured to become conductive in response to a voltage at a first portion of the word line reaching a threshold voltage at a third time based at least in part on the activation of the word line, the sense amplifier configured to sense the state of the memory cell based at least in part on the transistor becoming conductive; and
an additional transistor of the respective additional memory cell configured to become conductive in response to the voltage at a second portion of the word line reaching the threshold voltage at a fourth time different from the third time based at least in part on the activation of the word line, the at least one additional sense amplifier configured to sense the respective state of the respective additional memory cell based at least in part on the additional transistor becoming conductive.

6. The apparatus of claim 5, wherein a first delay between the second time and the first time corresponds to a second delay between the fourth time and the third time based at least in part on the signal line and the word line sharing one or more properties.

7. The apparatus of claim 5, wherein a third delay between the third time and the first time corresponds to a fourth delay between the fourth time and the second time based at least in part on the signal line and the word line sharing one or more properties.

8. The apparatus of claim 1, further comprising:
a substrate, wherein the word line and the signal line are equidistant from the substrate.

9. The apparatus of claim 1,
wherein the sense amplifier is configured to sense the state of the memory cell based at least in part on a signal carried by the digit line.

10. The apparatus of claim 1, wherein the sense amplifier is located at a circuit-under-array level of the memory device, the circuit-under-array level different from the memory array level.

11. The apparatus of claim 1, wherein the signal line and the word line both comprise a same material.

12. The apparatus of claim 1, wherein the signal line and the word line both have a same cross-sectional area.

13. The apparatus of claim 1, wherein the signal line comprises a dummy word line.

14. The apparatus of claim 13, wherein the dummy word line is coupled with a dummy memory cell of the memory device.

15. A method, comprising:
determining a memory cell to access, the memory cell coupled with a word line and at a memory array level of a memory device;
activating the word line coupled with the determined memory cell;
generating an activation signal for a sense amplifier based at least in part on determining the memory cell to access, the activation signal routed to the sense amplifier over a signal line located at the memory array level of the memory device, the signal line running parallel to the word line at the memory array level of the memory device; and
sensing, at the sense amplifier, a state of the memory cell in response to the activation signal and based at least in part on activating the word line.

16. The method of claim 15, wherein the memory cell is in a row with one or more additional memory cells at the memory array level of the memory device, the one or more additional memory cells further coupled with the word line, the method further comprising:
sensing, at one or more additional sense amplifiers, respective states of the one or more additional memory cells in response to the activation signal and based at least in part on activating the word line.

17. The method of claim 16, wherein:
the sense amplifier senses the state of the memory cell at a first time based at least in part on a first distance traveled by the activation signal on the signal line from a source of the activation signal to the sense amplifier; and
an additional sense amplifier of the one or more additional sense amplifiers senses a respective state of an additional memory cell of the one or more additional memory cells at a second time different from the first time based at least in part on a second distance traveled by the activation signal on the signal line from the source of the activation signal to the additional sense amplifier, the second distance different from the first distance.

18. The method of claim 17, further comprising:
developing a signal on a digit line based at least in part on a voltage of a first portion of the word line reaching a threshold voltage at a third time in response to activating the word line, wherein the memory cell is coupled with the first portion of the word line, and wherein sensing the state of the memory cell is based at least in part on the signal on the digit line; and
developing an additional signal on an additional digit line based at least in part on the voltage of a second portion of the word line reaching the threshold voltage at a fourth time in response to activating the word line, wherein the additional memory cell is coupled with the second portion of the word line, and wherein sensing the respective state of the additional memory cell is based at least in part on the additional signal on the additional digit line.

19. The method of claim 18, wherein a first propagation delay between the second time and the first time and associated with the signal line corresponds to a second propagation delay between the fourth time and the third time and associated with the word line.

20. The method of claim 19, wherein the first propagation delay corresponds to the second propagation delay based at least in part on the signal line and the word line sharing a conductive property.

21. The method of claim 15, wherein the sense amplifier is located at a circuit-under-array level of the memory device different from the memory array level of the memory device.

22. The method of claim 15, wherein the signal line comprises a dummy word line.

23. An apparatus, comprising:
a plurality of sense amplifiers each corresponding to a respective digit line of a plurality of digit lines and configured to sense one or more memory cells within a respective column of a memory array, the one or more memory cells within the respective column couplable with the respective digit line;
a word line coupled with a plurality of memory cells within a row of the memory array, each digit line of the plurality of digit lines couplable with a respective memory cell of the plurality of memory cells; and
a signal line located at a memory array level of a memory device and running parallel to the word line at the memory array level of the memory device, the signal line coupled with the plurality of sense amplifiers by a plurality of interconnects each corresponding to a respective sense amplifier of the plurality of sense amplifiers, wherein the signal line is configured to carry an activation signal, and wherein each sense amplifier of the plurality of sense amplifiers is configured to be activated based at least in part on the activation signal reaching the respective sense amplifier over a respective interconnect of the plurality of interconnects.

24. The apparatus of claim 23, wherein:
the signal line and a plurality of word lines each extend in a first direction parallel to a substrate, the plurality of word lines comprising the word line;
the plurality of digit lines each extend in a second direction parallel to the substrate, the second direction different from the first direction; and
the plurality of digit lines each extend across the plurality of word lines and terminate before reaching a plane that intersects the signal line, the plane perpendicular to the substrate.

25. An apparatus, comprising:
a plurality of sense amplifiers each corresponding to a respective digit line of a plurality of digit lines and configured to sense one or more memory cells within a respective column of a memory array, the one or more memory cells within the respective column couplable with the respective digit line;
a word line coupled with a plurality of memory cells within a row of the memory array, each digit line of the plurality of digit lines couplable with a respective memory cell of the plurality of memory cells; and
a signal line located at a memory array level of a memory device and running parallel to the word line at the memory array level of the memory device, the signal line coupled with the plurality of sense amplifiers by a plurality of interconnects each corresponding to a respective sense amplifier of the plurality of sense amplifiers, wherein the signal line is configured to carry an activation signal, and wherein each sense amplifier of the plurality of sense amplifiers is configured to be activated based at least in part on the activation signal reaching the respective sense amplifier over a respective interconnect of the plurality of interconnects, wherein:
the signal line and a plurality of word lines each extend in a first direction parallel to a substrate, the plurality of word lines comprising the word line;
the plurality of digit lines each extend in a second direction parallel to the substrate, the second direction different from the first direction; and
the plurality of digit lines each extend across the plurality of word lines and across the signal line, wherein one or more interconnects of the plurality of interconnects are coupled with the signal line between digit lines of the plurality of digit lines.

26. The apparatus of claim 25, wherein the one or more interconnects are coupled with the signal line between the digit lines of the plurality of digit lines based at least in part on a self-aligned contact process.

27. The apparatus of claim 23, wherein each interconnect of the plurality of interconnects is coupled with a respective switch gate for the respective sense amplifier of the plurality of sense amplifiers.

28. An apparatus, comprising:
a plurality of sense amplifiers each corresponding to a respective digit line and configured to sense one or more memory cells within a respective column of a memory array, the one or more memory cells within the respective column couplable with the respective digit line;
a word line coupled with a first subset of memory cells within a row of the memory array and a second subset of memory cells within the row of the memory array, each digit line of a first subset of digit lines couplable with a respective memory cell of the first subset of memory cells and each digit line of a second subset of digit lines couplable with a respective memory cell of the second subset of memory cells, wherein digit lines of the first subset of digit lines are separated by first gaps of a first width, digit lines of the second subset of digit lines are separated by second gaps of the first width, and the first subset of digit lines is separated from the second subset of digit lines by a third gap of a second width larger than the first width; and
a signal line coupled with the plurality of sense amplifiers by a first interconnect and a second interconnect, the first interconnect coupled with a portion of the signal line that is aligned with the third gap of the second width between the first subset of digit lines and the second subset of digit lines, wherein:
the first interconnect corresponds to each sense amplifier of a first subset of sense amplifiers that are coupled with respective digit lines of the first subset of digit lines;
the second interconnect corresponds to each sense amplifier of a second subset of sense amplifiers coupled with respective digit lines of the second subset of digit lines; and
the signal line is configured to carry an activation signal, each sense amplifier of the plurality of sense amplifiers configured to be activated based at least in part on the activation signal reaching the sense amplifier over the first interconnect or the second interconnect.

29. The apparatus of claim 28, further comprising:
a first plate coupled with the first subset of memory cells; and
a second plate coupled with the second subset of memory cells, wherein the first interconnect extends between the first plate and the second plate.

30. A method, comprising:
activating a word line based at least in part on an access operation for a first memory cell and a second memory cell, the word line coupled with the first memory cell and the second memory cell;
routing, based at least in part on the access operation, an activation signal to a first sense amplifier and a second sense amplifier using a signal line located at a memory array level of a memory device, the signal line running parallel to the word line at the memory array level;

activating the first sense amplifier to sense a first state of the first memory cell at a first time based at least in part on a first portion of the signal line reaching a threshold voltage at the first time, the first portion of the signal line coupled with the first sense amplifier; and activating the second sense amplifier to sense a second state of the second memory cell at a second time different from the first time based at least in part on a second portion of the signal line reaching the threshold voltage at the second time, the second portion of the signal line coupled with the second sense amplifier.

31. The method of claim 30, further comprising:

determining the first state of the first memory cell based at least in part on activating the word line coupled with the first memory cell and activating the first sense amplifier; and determining the second state of the second memory cell based at least in part on activating the word line coupled with the second memory cell and activating the second sense amplifier.

32. The method of claim 30, wherein the first sense amplifier is activated at the first time and the second sense amplifier is activated at the second time based at least in part on a propagation delay of the activation signal over the signal line.

33. The method of claim 32, further comprising:

developing a first signal on a first digit line based at least in part on a first portion of the word line reaching a second threshold voltage at a third time in response to activating the word line, wherein the first memory cell is coupled with the first portion of the word line, and wherein sensing the first state of the first memory cell is based at least in part on the first signal on the first digit line; and developing a second signal on a second digit line based at least in part on a second portion of the word line reaching the second threshold voltage at a fourth time different from the third time in response to activating the word line, wherein the second memory cell is coupled with the second portion of the word line, wherein sensing the second state of the second memory cell is based at least in part on the second signal on the second digit line, and wherein the first signal is developed on the first digit line at the third time and the second signal is developed on the second digit line at the fourth time based at least in part on a second propagation delay of a third signal over the word line.

34. The method of claim 33, wherein the propagation delay of the activation signal over the signal line is the same as the second propagation delay of the third signal over the word line.

* * * * *